United States Patent
Kato et al.

(10) Patent No.: US 10,026,606 B2
(45) Date of Patent: Jul. 17, 2018

(54) METHOD FOR DEPOSITING A SILICON NITRIDE FILM

(71) Applicant: Tokyo Electron Limited, Tokyo (JP)

(72) Inventors: Hitoshi Kato, Iwate (JP); Yutaka Takahashi, Iwate (JP); Masahiro Murata, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/637,208

(22) Filed: Jun. 29, 2017

(65) Prior Publication Data

US 2018/0019114 A1 Jan. 18, 2018

(30) Foreign Application Priority Data

Jul. 13, 2016 (JP) .................................. 2016-138213

(51) Int. Cl.
*H01L 21/02* (2006.01)
*H01L 21/28* (2006.01)
*C23C 16/34* (2006.01)

(52) U.S. Cl.
CPC ........ *H01L 21/0217* (2013.01); *C23C 16/345* (2013.01); *H01L 21/28202* (2013.01)

(58) Field of Classification Search
CPC ........... H01L 21/0217; H01L 21/28202; C23C 16/345
See application file for complete search history.

(56) References Cited

U.S. PATENT DOCUMENTS

| 8,900,963 B2* | 12/2014 | Sills | H01L 45/1233 257/2 |
| 2006/0199399 A1* | 9/2006 | Muscat | C23C 16/0272 438/798 |
| 2008/0242097 A1* | 10/2008 | Boescke | C30B 25/04 438/703 |
| 2015/0217330 A1* | 8/2015 | Haukka | B05D 3/107 427/343 |
| 2017/0140920 A1* | 5/2017 | Arnepalli | H01L 21/0262 |
| 2017/0140931 A1* | 5/2017 | Van Cleemput | H01L 21/02126 |

FOREIGN PATENT DOCUMENTS

JP 2012-138501 7/2012

* cited by examiner

*Primary Examiner* — William Coleman
(74) *Attorney, Agent, or Firm* — IPUSA, PLLC

(57) ABSTRACT

A method for depositing a silicon nitride film is provided. A nitrided adsorption site is formed in a recess formed in a surface of a substrate by supplying an ammonia-containing gas to the substrate for nitriding the surface of the substrate including the recess. A non-adsorption site is formed in a predetermined upper area of the recess by adsorbing a chlorine-containing gas on the nitride adsorption site in the predetermined upper area by physical adsorption. The predetermined upper area ranges from an upper end of the recess to a predetermined depth of the recess. A silicon-containing gas is adsorbed on the nitride adsorption site other than the predetermined upper area so as to deposit a silicon nitride film by a chemical reaction between the adsorbed ammonia-containing gas and the adsorbed silicon-containing gas. The nitride adsorption site includes a bottom surface of the recess.

10 Claims, 20 Drawing Sheets

FIG.10B

| Atom | Electronegativity |
|---|---|
| F | 4.0 |
| O | 3.5 |
| Cl | 3.0 |
| N | 3.0 |
| C | 2.0 |
| Si | 1.8 |
| H | 2.1 |

FIG.10C

| Bond | Bond Dissociation Energy KJ/mol | Δ Electronegativity |
|---|---|---|
| Si-O | 799 | 1.7 |
| Si-F | 576 | 2.2 |
| N-H | 339 | 0.9 |
| Si-N | 437 | 1.2 |
| Cl-Cl | 436 | 0 |
| H-Cl | 431 | 0.9 |
| Si-Cl | 416 | 1.2 |
| N-H | 339 | 0.9 |
| N-Cl | 334 | 0 |
| Si-Si | 310 | 0 |
| Si-H | 293 | 0.3 |

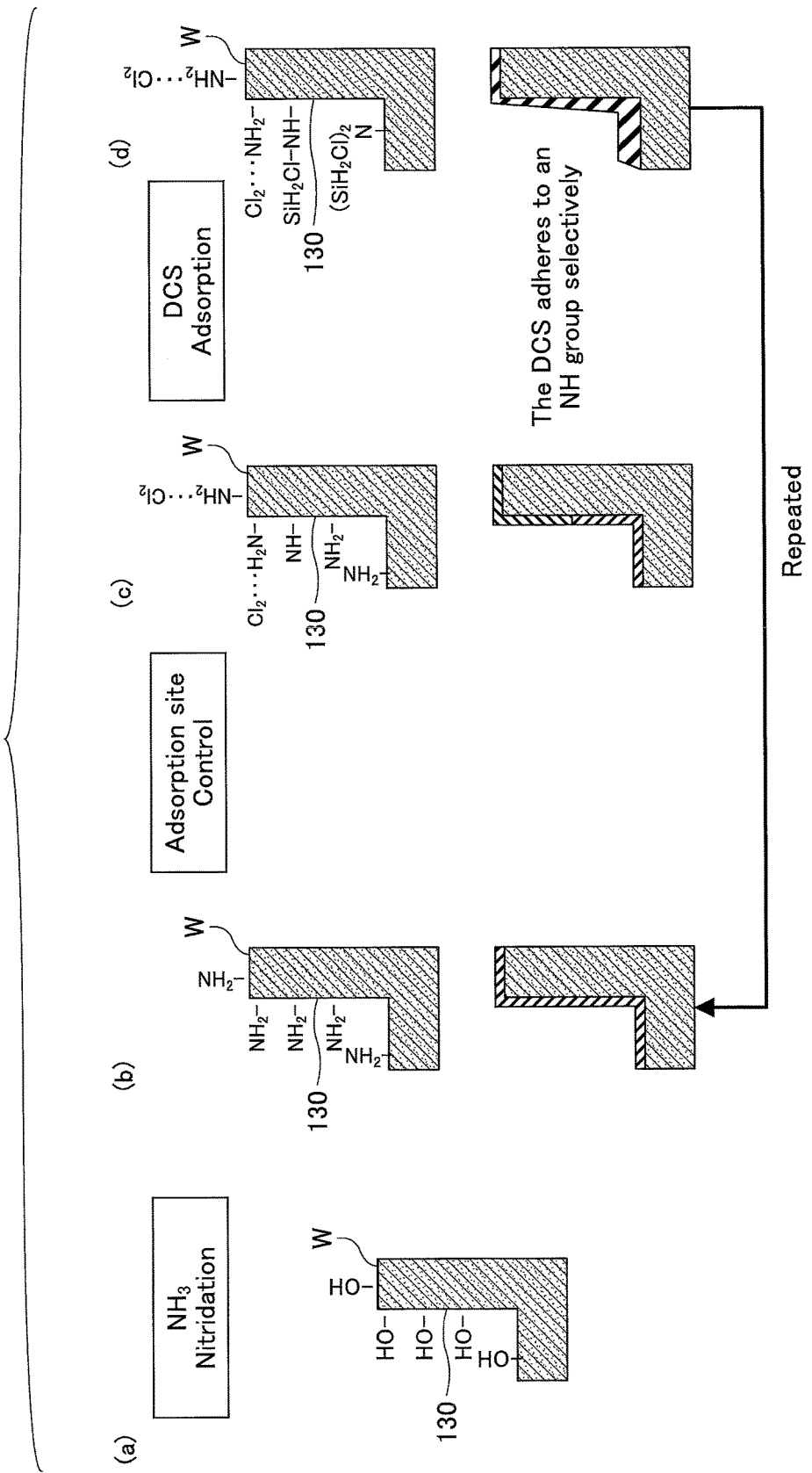

METHOD FOR DEPOSITING A SILICON NITRIDE FILM

CROSS-REFERENCE TO RELATED APPLICATIONS

This patent application is based upon and claims the benefit of priority of Japanese Patent Application No. 2016-138213, filed on Jul. 13, 2016, the entire contents of which are incorporated herein by reference.

BACKGROUND OF THE INVENTION

1. Field of the Invention The present disclosure relates to a method for depositing a silicon nitride film.

2. Description of the Related Art

Japanese Patent Application Publication No. 2012-138501 discloses a trench filling method that includes steps of forming an oxide barrier layer inside a trench formed in a semiconductor substrate, forming an expandable film on the oxide barrier layer, and filling the trench with a filling material which contracts by being fired. In the method, the step of forming the oxide barrier layer includes steps of forming a first seed layer inside the trench, and forming a silicon nitride film on the first seed layer, and the step of forming the expandable film on the oxide barrier layer includes steps of forming a second seed layer on the silicon nitride film, and forming a silicon film on the second seed layer.

The trench filling method disclosed in Japanese Patent Application Publication No. 2012-138501 enables the expandable film and the oxide barrier layer to be formed inside the trench even if miniaturization of trenches further develops.

However, in some cases, processes require filling a recess such as a fine trench for wiring with a silicon nitride film with preferable filling characteristics without generating a void, not with the expandable film as disclosed in Japanese Patent Application Publication No. 2012-138501. In such cases, just filling the recess with a film so as to conform to a shape of the recess may be insufficient, and the recess may not be preferably filled up with the silicon nitride film unless the silicon nitride film gradually fills the recess while maintaining a V-shaped cross section so as not to close the opening of the recess. In other words, because the recess is very fine, even if the film is intended to be deposited so as to conform to the surface of the recess, the film may close the opening of the recess while leaving a void in a middle portion of the recess. In such film deposition, generation of the void cannot be prevented unless the recess is gradually filled with the film while maintaining a V-shaped opening cross-section in the film as discussed above.

SUMMARY OF THE INVENTION

Embodiments of the present invention provide a method for depositing a silicon nitride film solving one or more of the problems discussed above.

More specifically, embodiments of the present disclosure provide a method for depositing a silicon nitride film that can fill a recess with a silicon nitride film with preferable filling characteristics while preventing generation of a void.

According to one embodiment of the present invention, there is provided a method for depositing a silicon nitride film is provided. A nitrided adsorption site is formed in a recess formed in a surface of a substrate by supplying an ammonia-containing gas to the substrate for nitriding the surface of the substrate including the recess. A non-adsorption site is formed in a predetermined upper area of the recess by adsorbing a chlorine-containing gas on the nitride adsorption site in the predetermined upper area by physical adsorption. The predetermined upper area ranges from an upper end of the recess to a predetermined depth of the recess. A silicon-containing gas is adsorbed on the nitride adsorption site other than the predetermined upper area so as to deposit a silicon nitride film by a chemical reaction between the adsorbed ammonia-containing gas and the adsorbed silicon-containing gas. The nitride adsorption site includes a bottom surface of the recess.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIGS. 10A through 10C are diagrams for explaining a difference of electronegativity between chlorine and hydrogen;

FIG. 11 is a diagram illustrating an example of a method for depositing a silicon nitride film according to an embodiment of the present disclosure;

DETAILED DESCRIPTION OF THE PREFERRED EMBODIMENTS

Embodiments of the present invention are described below with reference to accompanying drawings.

<Configuration of Film Deposition Apparatus>

Figure 1:
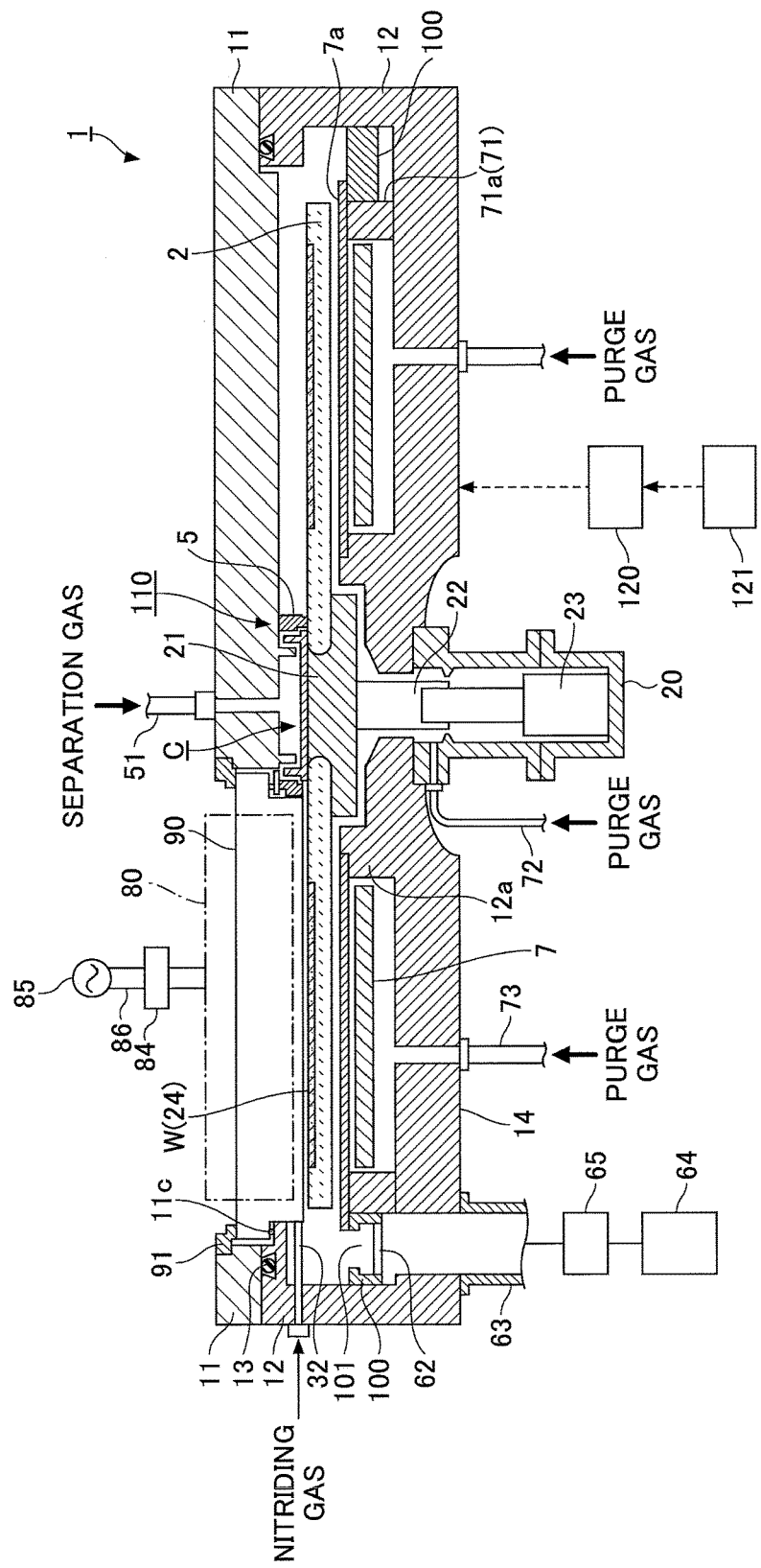
FIG. 1 is a schematic vertical cross-sectional view illustrating an example of a film deposition apparatus applicable to a method for depositing a silicon nitride film according to an embodiment of the present disclosure.
Figure 2:
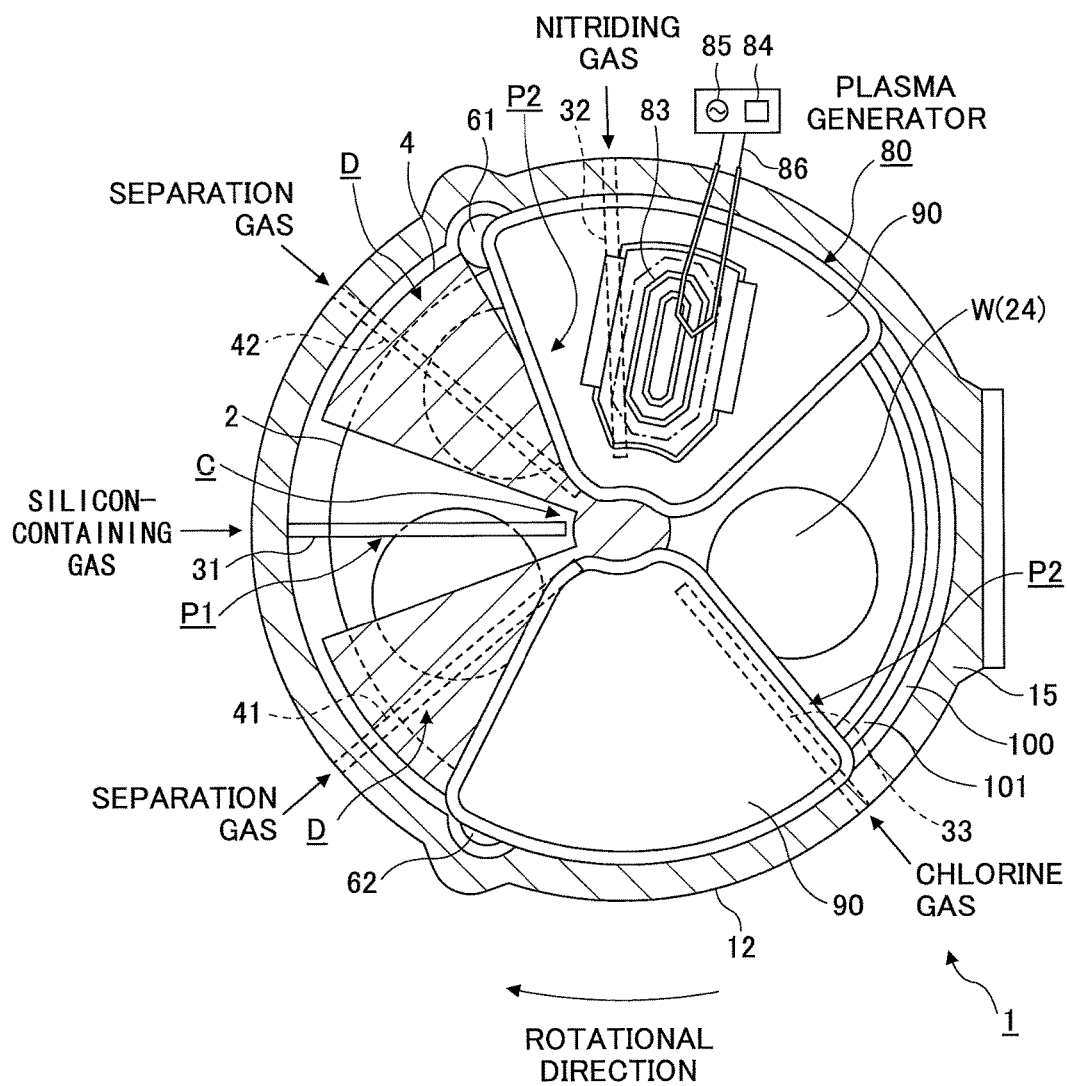
FIG. 2 is a schematic plan view illustrating an example of a film deposition apparatus for performing an embodiment of the present disclosure.

FIG. 1 is a schematic vertical cross-sectional view illustrating an example of a film deposition apparatus preferable to perform a method for depositing a silicon nitride film according to an embodiment of the present disclosure. FIG. 2 is a schematic plan view illustrating an example of the film deposition apparatus preferable to perform the method for depositing the silicon nitride film according to the embodiment of the present disclosure. Here, in FIG. 2, a depiction of a ceiling plate 11 is omitted for the purpose of illustration.

As illustrated in FIG. 1, the film deposition apparatus according to the embodiment of the present disclosure includes a vacuum chamber 1 having an approximately circular planar shape, and a turntable 2 provided in the vacuum chamber 1 and having its rotational center in common with the center of the vacuum chamber 1 to rotate a wafer W placed thereon.

The vacuum chamber 1 includes a ceiling plate (ceiling part) 11 provided in a position facing concave portions 24 of the turntable 2 described later, and a chamber body 12. Moreover, a seal member 13 having a ring-like shape is provided in a periphery in an upper surface of the chamber body 12. The ceiling plate 11 is configured to be detachable and attachable from and to the chamber body 12. A diameter dimension (inner diameter dimension) of the vacuum chamber 1 when seen in a plan view is not limited, but can be, for example, set at about 1100 mm.

A Separation gas supply pipe 51 is connected to a central part in an upper surface of the ceiling plate 11 and is further in communication with a central part on the upper surface side of a space within the vacuum chamber 1 to supply a separation gas for preventing different process gases from mixing with each other in a central area C.

The turntable 2 is fixed to a core portion 21 having an approximately cylindrical shape at the central part, and is configured to be rotatable by a drive unit 23 in a clockwise fashion as illustrated in FIG. 2 as an example, around a rotational shaft 22 connected to a lower surface of the core portion 21 and extending in a vertical direction, which forms a vertical axis. The diameter dimension of the turntable 2 is not limited, but can be set at, for example, about 1000 mm.

The rotational shaft 22 and the drive unit 23 are accommodated in a casing body 20, and a flange portion on the upper surface side of the casing body 20 is hermetically attached to a lower surface of a bottom portion of the vacuum chamber 1. A purge gas supply pipe 72 for supplying argon (Ar) gas or the like as a purge gas (separation gas) is connected to an area below the turntable 2.

A peripheral side of the core portion 21 in a bottom part 14 of the vacuum chamber 1 forms a protruding part 12a by being formed into a ring-like shape so as to come to close to the lower surface of the turntable 2.

As shown in FIG. 2, circular concave portions 24 are formed in a surface of the turntable 2 as a substrate receiving area to receive wafers W having a diameter dimension of, for example, 300 mm thereon. The concave portions 24 are provided at a plurality of locations, for example, at five locations along a rotational direction of the turntable 2. Each of the concave portions 24 has an inner diameter slightly larger than the diameter of the wafer W, more specifically, larger than the diameter of the wafer W by about 1 to 4 mm. Furthermore, the depth of each of the concave portions 24 is configured to be approximately equal to or greater than the thickness of the wafer W. Accordingly, when the wafer W is accommodated in the concave portion 24, the surface of the wafer W is as high as, or lower than a surface of the turntable 2 where the wafer W is not placed. Here, even when the depth of each of the concave portions 24 is greater than the thickness of the wafer W, the depth of each of the concave portion 24 is preferred to be equal to or smaller than about three times the thickness of the wafer W because too deep concave portions 24 may affect the film deposition.

Through holes not illustrated in the drawings are formed in a bottom surface of the concave portion 24 to allow, for example, three lifting pins described later to push up the wafer W from below and to lift the wafer W.

As illustrated in FIG. 2, multiple, for example, five nozzles 31, 32, 33, 41 and 42 each made of, for example, quartz are arranged in a radial fashion at intervals in the circumferential direction of the vacuum chamber 1 at respective positions opposite to a passing area of the concave portions 24. Each of the nozzles 31, 32, 33, 41 and 42 is arranged between the turntable 2 and the ceiling plate 11. These nozzles 31, 32, 34, 41 and 42 are each installed, for example, so as to horizontally extend facing the wafer W from an outer peripheral wall of the vacuum chamber 1 toward the central area C.

In the example illustrated in FIG. 2, a first process gas nozzle 31, a separation gas nozzle 42, a second process gas nozzle 32, a third process gas nozzle 33, and a separation gas nozzle 41 are arranged in a clockwise fashion (in the rotational direction of the turntable 2) in this order. However, the plasma processing apparatus according to the present embodiment is not limited to this form, and the turntable 2 may rotate in a counterclockwise fashion. In this case, the first process gas nozzle 31, the separation gas nozzle 42, the second process gas nozzle 32, the third process gas nozzle 33 and the separation gas nozzle 41 are arranged in this order in the counterclockwise fashion.

As illustrated in FIG. 2, a plasma generator 80 is provided above the second process gas nozzle 32, respectively, to convert a nitriding gas discharged from the second process gas nozzle 32. The plasma generator 80 is described later. An ammonia ($NH_3$) containing gas is used as the nitriding gas, for example.

Here, in the present embodiment, although an example of arranging a single nozzle in each process area is illustrated, a configuration of providing a plurality of nozzles in each process area is also possible. For example, the second process gas nozzle 32 may be constituted of a plurality of plasma processing gas nozzles, each of which is configured to supply argon (Ar) gas, ammonia ($NH_3$) gas, hydrogen ($H_2$) gas or the like, or maybe constituted of only a single plasma processing gas nozzle configured to supply a mixed gas of argon gas, ammonia gas and hydrogen gas.

The first process gas nozzle 31 forms a silicon-containing gas supply part. Moreover, the second process gas nozzle 32 forms a nitriding gas supply part, and the third process gas nozzle 33 forms a chlorine gas supply part. Furthermore, each of the separation gas nozzles 41 and 42 forms a separation gas supply part.

Each of the nozzles 31, 32, 33, 41 and 42 is connected to each gas supply source not illustrated in the drawings through a flow control valve.

The first process gas nozzle 31 supplies a silicon-containing gas that becomes a source gas of a silicon nitride film. The first process gas nozzle 31 may supply a variety of silicon-containing gases depending on the intended purpose. For example, silane-based gas such as DCS ($SiH_2Cl_2$, dichlorosilane) may be used.

Examples of the silicon-containing gas supplied from the first process gas nozzle 31 include DCS [dichlorosilane], HCD [hexachlorodisilane], DIPAS [diisopropylamino-silane], 3DMAS [tris(dimethylamino)silane] gas, BTBAS [bis(tertiary-butyl-amino)silane] or the like.

An ammonia-containing gas is cited as the nitriding gas supplied from the second process gas nozzle 32, and may contain argon, hydrogen and the like in addition to ammonia. The nitriding gas is preferably supplied while being activated by plasma to obtain a sufficient nitriding effect. Hence, as illustrated at FIG. 2, the plasma generator 80 is provided above the second process gas nozzle 32. Thus, the ammonia-containing gas is preferably supplied with argon, hydrogen and the like, for example, which are preferable to supply while converting to plasma.

The third process gas nozzle 33 supplies a chlorine-containing gas. The chlorine-containing gas is supplied to a surface of a nitrided wafer W or a surface of a silicon nitride film to form a non-adsorption site. More specifically, when a recess such as a trench or a via hole is formed in a surface of a wafer W, the chlorine-containing gas forms the non-adsorption site on an upper portion of the recess, and serves to urge a film to be deposited from the bottom surface side of the recess. To achieve this, the chlorine-containing gas is supplied from the third process gas nozzle 33. The chlorine-containing gas maybe chlorine gas alone, or may be supplied with another type of gas. Thus, the chlorine-containing gas supplied from the third process gas nozzle 33 includes both chlorine gas alone, and a mixed gas of chlorine gas and another type of gas.

For example, an inert gas such as nitrogen gas or argon (Ar) gas is cited as an example of the separation gas supplied from the separation gas nozzles 41 and 42.

As discussed above, in the example illustrated in FIG. 2, the first process gas nozzle 31, the separation gas nozzle 42, the second process gas nozzle 32, the third process gas nozzle 33 and the separation gas nozzle 41 are arranged in this order in a clockwise fashion (in the rotational direction of the turntable 2). In other words, in an actual process of the wafer W, the wafer W to which the silicon-containing gas is supplied from the first process gas nozzle 31 is sequentially exposed to the separation gas from the separation gas nozzle 42, the nitriding gas from the second process gas nozzle 32, the chlorine-containing gas from the third process gas nozzle 33, and the separation gas from the separation gas nozzle 41 in this order.

Gas discharge holes 34 for discharging each of the above-mentioned gases are formed in each lower surface (the surface facing the turntable 2) of the gas nozzles 31, 32, 33, 41 and 42 along a radial direction of the turntable 2 at a plurality of locations, for example, at regular intervals. Each of the nozzles 31, 32, 33, 41 and 42 is arranged so that a distance between a lower end surface of each of the nozzles 31, 32, 33, 41 and 42 and an upper surface of the turntable 2 is set at, for example, about 1 to 5 mm.

An area under the first process gas nozzle 31 is a first process area P1 to allow the silicon-containing gas (i.e., source gas) to adsorb on the wafer W. An area under the second process gas nozzle 32 is a second process area P2 to supply the nitriding gas while converting to plasma that can react with the silicon-containing gas adsorbed on the surface of the wafer W and produce a reaction product of SiN film, thereby depositing the reaction product on the entire surface of the recess formed in the surface of the wafer W. An area under the third process gas nozzle 33 is a third process area P3 to supply the chlorine-containing gas to the surface of the wafer W to form the non-adsorption site on the upper portion of the recess.

Figure 3:
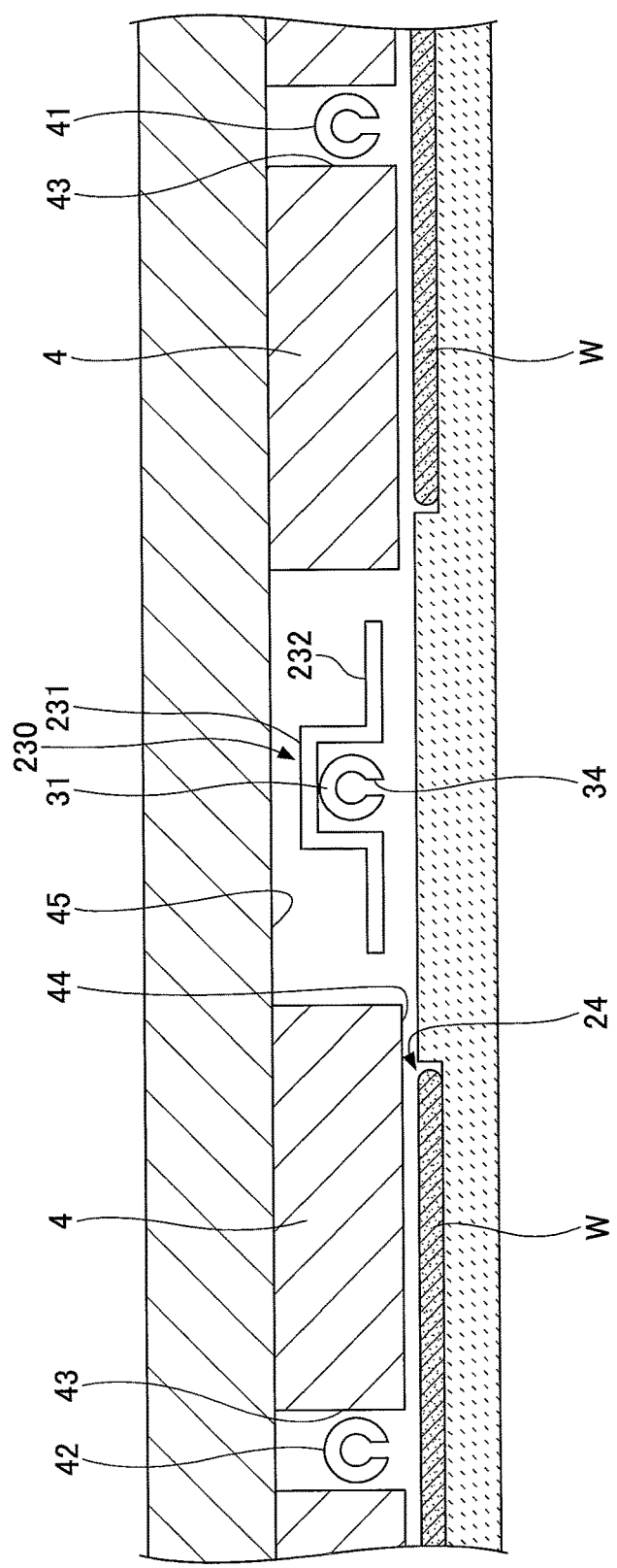
FIG. 3 is a cross-sectional view cut along a concentric circle of a turntable in a film deposition apparatus for performing an embodiment of the present disclosure.

FIG. 3 illustrates a cross-sectional view cut along a concentric circle of the turntable 2 of the film deposition apparatus of the embodiment. More specifically, FIG. 3 illustrates the cross-sectional view from one of the separation area D to the other separation area D by way of the first process area P1.

As shown in FIG. 3, approximately sectorial convex portions 4 are provided on the ceiling plate 11 of the vacuum chamber 1 in the separation areas D. Flat low ceiling surfaces 44 (first ceiling surfaces) that are lower surfaces of the convex portions 4 and ceiling surfaces 45 (second ceiling surfaces) that are higher than the ceiling surfaces 44 provided on both sides of the ceiling surfaces 44 in a circumferential direction, are formed in the vacuum chamber 1.

As illustrated in FIG. 2, the convex portions 4 forming the ceiling surfaces 44 have a fan-like planar shape whose apexes are cut into an arc-like shape. Moreover, each of the convex portions 4 has a groove portion 43 formed so as to extend in the radial direction in the center in the circumferential direction, and each of the separation gas nozzles 41 and 42 is accommodated in the groove portion 43. Here, a periphery of each of the convex portions 4 (a location on the peripheral side of the vacuum chamber 1) is bent into a L-shaped form so as to face an outer end surface of the turntable 2 and to be located slightly apart from the chamber body 12 in order to prevent each of the process gas from mixing with each other.

As illustrated in FIG. 3, a nozzle cover 230 is provided on the upper side of the first process gas nozzle 31 in order to cause the first process gas to flow along the wafer W and so as to cause the separation gas to flow through a location close to the ceiling plate 11 of the vacuum chamber 1 while flowing away from the neighborhood of the wafer W. As illustrated in FIG. 3, the nozzle cover 230 includes an approximately box-shaped cover body 231 whose lower surface side is open to accommodate the first process gas nozzle 31, and current plates 232 having a plate-like shape and connected to the lower open ends of the cover body 231 on both upstream and downstream sides in the rotational direction of the turntable 2. Here, a side wall surface of the cover body 231 on the rotational center side of the turntable 2 extends toward the turntable 2 (i.e., downward) so as to face a tip of the first process gas nozzle 31. In addition, the side wall surface of the cover body 231 on the peripheral side of the turntable 2 is cut off so as not to interfere with the first process gas nozzle 31.

Next, the plasma generator 80 provided above the second process gas nozzles 32 are described below in detail.

Figure 4:
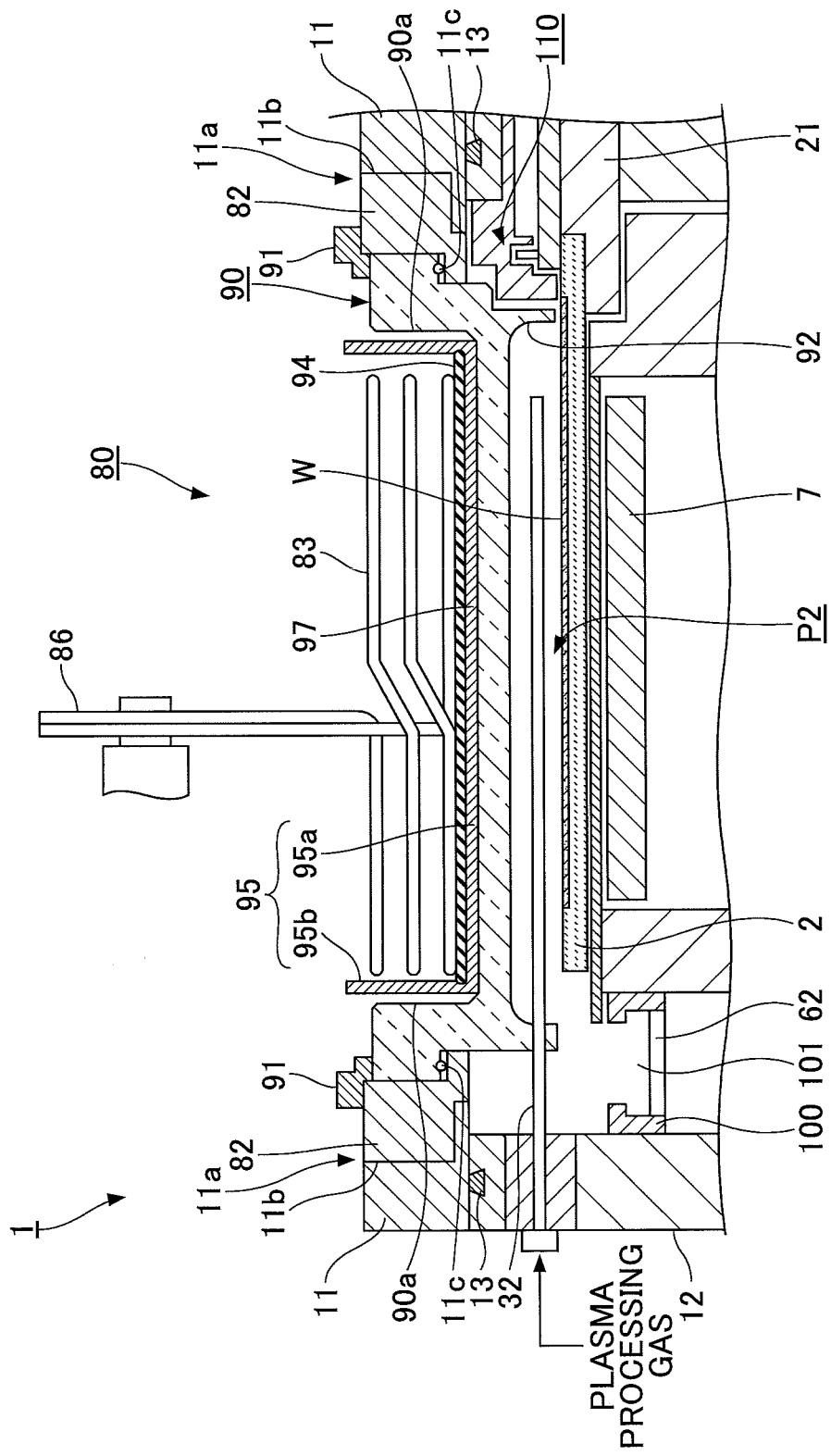
FIG. 4 is a vertical cross-sectional view illustrating an example of a plasma generator in a film deposition apparatus for performing an embodiment of the present disclosure.
Figure 5:
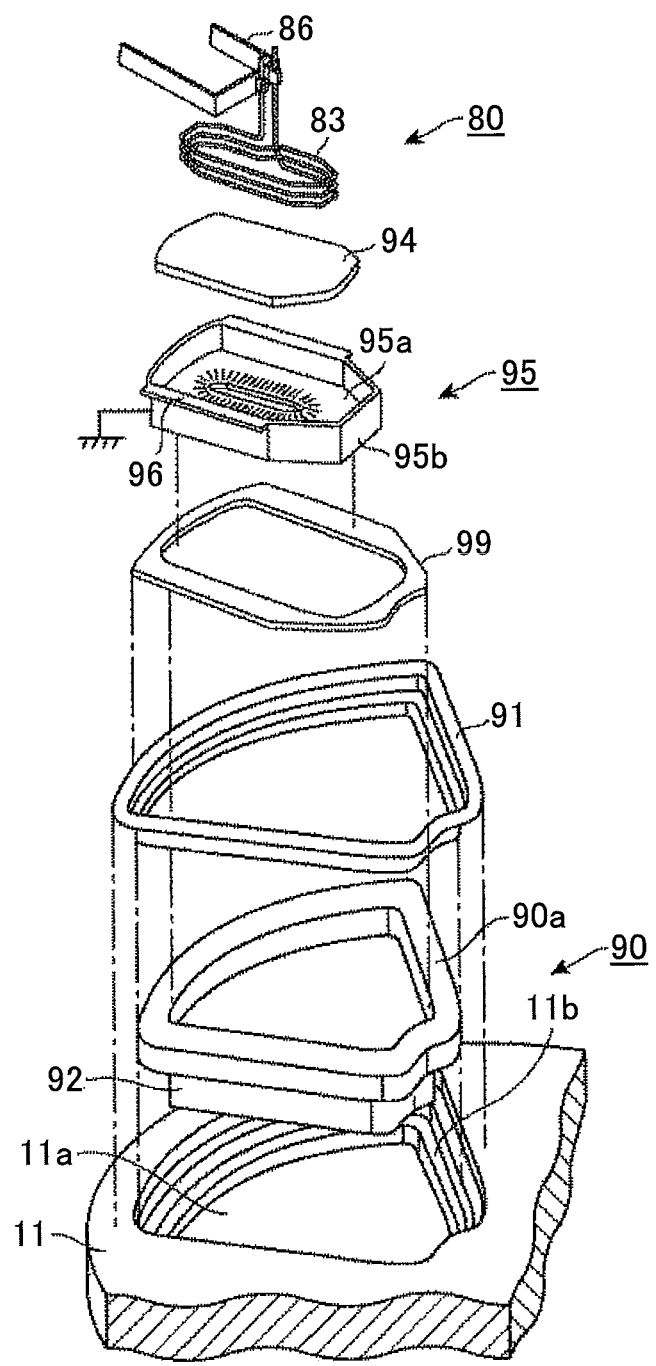
FIG. 5 is an exploded perspective view illustrating an example of a plasma generator in a film deposition apparatus for performing an embodiment of the present disclosure.
Figure 6:
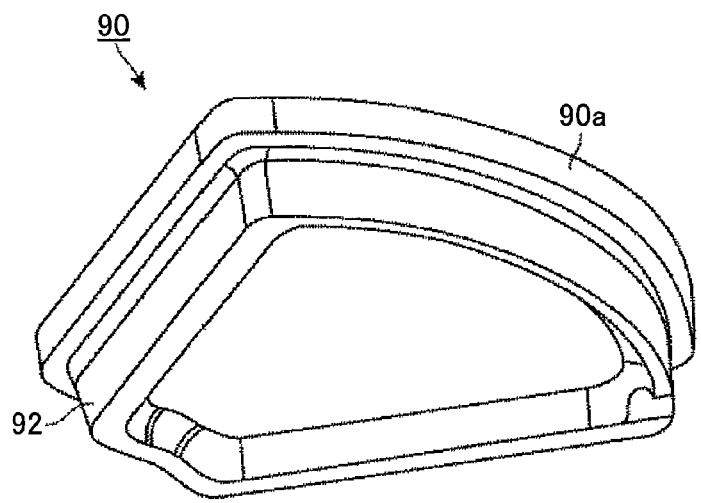
FIG. 6 is a perspective view illustrating an example of a housing provided in a plasma generator in a film deposition apparatus for performing an embodiment of the present disclosure.

FIG. 4 illustrates a vertical cross-sectional view of an example of the plasma generator 80 of the film deposition apparatus used in the method for depositing the silicon nitride film according to the embodiment of the present disclosure. Also, FIG. 5 illustrates an exploded perspective view of an example of the plasma generator 80 of the film deposition apparatus according to the embodiment of the present disclosure. Furthermore, FIG. 6 illustrates a perspective view of an example of a housing provided in the plasma generator 80.

The plasma generator 80 is configured to wind an antenna 83 constituted of a metal wire or the like, for example, triply around the vertical axis. Moreover, as illustrated in FIG. 2, the plasma generator 80 is arranged so as to surround a band area extending in the radial direction of the turntable 2 and to cross the diameter of the wafer W on the turntable 2 when seen in a plan view.

The antenna 83 is, for example, connected to the radio frequency power source 85 having a frequency of 13.56 MHz and an output power of 5000 W by way of the matching box 84. Then, the antenna 83 is provided to be hermetically separated from an inner area of the vacuum chamber 1. Here, a connection electrode 86 is provided to electrically connect the antenna 83 with the matching box 84 and the radio frequency power source 85.

As illustrated in FIGS. 4 and 5, an opening 11a having an approximately fan-like shape when seen in a plan view, is formed in the ceiling plate 11 above the second process gas nozzle 32.

As illustrated in FIG. 4, an annular member 82 is hermetically provided in the opening 11a along the verge of the opening 11a. The housing 90 described later is hermetically provided on the inner surface side of the annular member 82. In other words, the annular member 82 is hermetically provided at a position where the outer peripheral side of the annular member 82 faces the inner surface 11b of the opening 11a in the ceiling plate 11 and the inner peripheral side of the annular member 82 faces a flange part 90a of the housing 90 described later. The housing 90 made of, for example, a derivative of quartz is provided in the opening 11a through the annular member 82 in order to arrange the antenna 83 at a position lower than the ceiling plate 11.

FIG. 6 is a diagram illustrating an example of the housing 90 of the plasma generator 80. As illustrated in FIG. 6, the housing 90 is configured to have a peripheral part horizontally extending along the circumferential direction on the upper side so as to form the flange part 90a and a central part getting recessed inward toward the inner area of the vacuum chamber 1 when seen in a plan view.

The housing 90 is arranged to cross the diameter of the wafer W in the radial direction of the turntable 2 when the wafer W is located under the housing 90. Here, as illustrated in FIG. 4, a seal member 11c such as an O-ring or the like is provided between the annular member 82 and the ceiling plate 11.

An internal atmosphere of the vacuum chamber 1 is sealed by the annular member 82 and the housing 90. More specifically, the annular member 82 and the housing 90 are set in the opening 11a, and then the housing 90 is pressed downward through the whole circumference by a pressing member 91 formed into a frame-like shape along the contact portion of the annular member 82 and the housing 90. Furthermore, the pressing member 91 is fixed to the ceiling plate 11 by volts and the like not illustrated in the drawings. Thus, the internal atmosphere of the vacuum chamber 1 is set to be sealed. Here, in FIG. 5, a depiction of the annular member 82 is omitted for simplification.

As illustrated in FIG. 2, the housing 90 is also provided above the third process area P3, that is, above the third process gas nozzle 33. The plasma generator 80 is not provided at the third process area P3. However, because the nitriding gas is supplied in the second process area P2 while the chlorine-containing gas is supplied in the third process area P3, only the housing 90 is provided as a partition to prevent two kinds of gases from mixing with each other.

As illustrated in FIG. 6, a projection portion 92 vertically extending toward the turntable 2 is formed in a lower surface of the housing 90 so as to surround each of the process areas P2 and P3 under the housing 90 along each circumferential direction thereof. Then, the second process gas nozzle 32 is accommodated in an area surrounded by an inner circumferential surface of the projection portion 92, the lower surface of the housing 90 and the upper surface of the turntable 2. Here, the projection portion 92 at the base end portion (the inner wall side of the vacuum chamber 1) of the second process gas nozzle 32 is cut off so as to be formed into an approximately arc-like form along the outer shape of the second process gas nozzle 32.

As illustrated in FIG. 4, the projection portion 92 is formed on the lower side of the housing 90 along the circumferential direction thereof. The projection portion 92 prevents the seal member 11c from being exposed to the plasma, thereby separating the seal member 11c from the plasma generation space. Because of this, even if the plasma is likely to diffuse, for example, toward the seal member 11c side, because the plasma goes to the seal member 11c by way of the lower side of the projection portion 92, the plasma becomes inactivated before reaching the seal member 11c.

A grounded Faraday shield 95 that is formed so as to approximately fit along an inner shape of the housing 90 and is made of a conductive plate-like body, for example, a metal plate such as a copperplate and the like, is installed in the housing 90. The Faraday shield 95 includes a horizontal surface 95a horizontally formed so as to be along the bottom surface of the housing 90, and a vertical surface 95b extending upward from the outer edge of the horizontal surface 95a through the whole circumference, and may be configured to be approximately hexagon when seen in a plan view.

Figure 7:
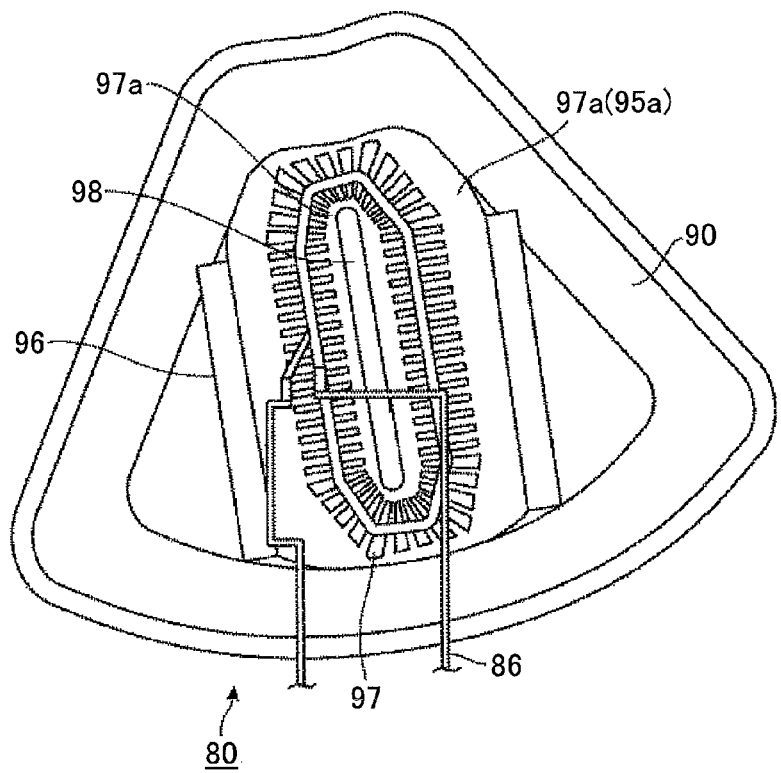
FIG. 7 is a plan view illustrating an example of a plasma generator in a film deposition apparatus for performing an embodiment of the present disclosure.
Figure 8:
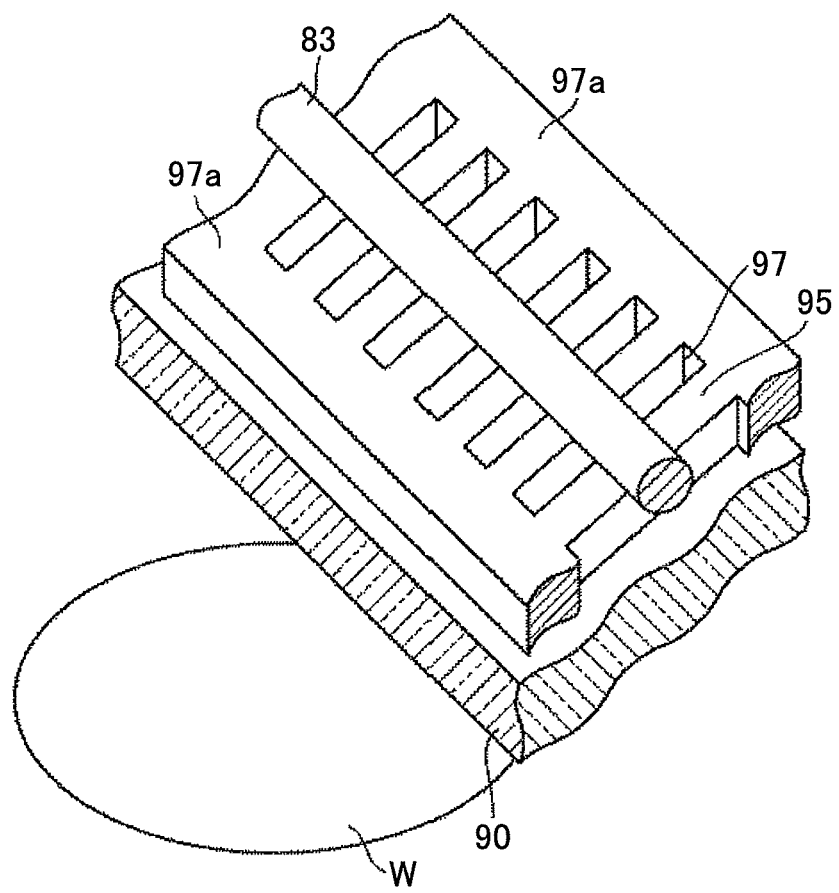
FIG. 8 is a perspective view illustrating a part of a Faraday shield provided in a plasma generator in a film deposition apparatus for performing an embodiment of the present disclosure.

FIG. 7 illustrates a plan view of an example of the first plasma generator 80 according to the present embodiment, and FIG. 8 illustrates a perspective view of a part of the Faraday shield provided in the plasma generator according to the present embodiment.

Upper end edges of the Faraday shield 95 on the right side and the left side extend rightward and leftward, respectively, when seen from the rotational center of the turntable 2 horizontally, and form supports 96. As illustrated in FIG. 5, a frame body 99 is provided between the Faraday shield 95 and the housing 90 to support the support 96 from below and so as to be supported by the flange part 90a of the housing 90 on the central area C side and the outer peripheral side of the turntable 2.

When an electric field generated by the antenna 83 reaches the wafer W, a pattern (electrical wiring and the like) formed inside the wafer W may be electrically damaged. Because of this, as illustrated in FIG. 8, many slits 97 are formed in the horizontal surface 95a in order to prevent an electric field component of the electric field and a magnetic field (i.e., an electromagnetic field) generated by the antenna 83 from going toward the wafer W located below and to allow the magnetic field to reach the wafer W.

As illustrated in FIGS. 7 and 8, the slits 97 are formed under the antenna 83 along the circumferential direction so as to extend in a direction perpendicular to a winding direction of the antenna 83. Here, the slits 97 are formed to have a width dimension equal to or less than about 1/10000 of a wavelength of the high frequency power supplied to the antenna 83. Moreover, electrically conducting paths 97a made of a grounded electric conductor and the like are arranged on one end and the other end in a lengthwise direction of each of the slits 97a so as to stop open ends of the slits 97a. An opening 98 is formed in an area out of the area where the slits 97 are formed in the Faraday shield 95, that is to say, at the central side of the area where the antenna 83 is wound around to be able to observe a light emitting state of the plasma therethrough. Here, in FIG. 2, the. slits 97 are omitted for simplicity, and an example of the slit formation area is expressed by alternate long and short dash lines.

As illustrated in FIG. 5, an insulating plate 94 made of quartz and the like having a thickness dimension of, for example, about 2 mm, is stacked on the horizontal surface 95a of each of the Faraday shields 95 in order to ensure insulation properties from the plasma generator 80 placed on the Faraday shield 95. In other words, the plasma generator 80 is arranged so as to face the inside of the vacuum chamber 1 (the wafer W on the turntable 2) through the housing 90, the Faraday shield 95 and the insulating plate 94.

In the third process area P3, only the housing 90 illustrated in FIG. 5 is provided, and the components on and above the housing 90 including the plasma generator 80 do not have to be provided.

The other components of the plasma processing apparatus according to the present invention are described below again.

As illustrated in FIGS. 1 and 2, a side ring 100 that forms a cover body is arranged at a position slightly lower than the turntable 2 and at the periphery of the turntable 2. Exhaust openings 61 and 62 are formed in an upper surface of the side ring 100 at two locations apart from each other in the circumferential direction. In other words, two exhaust ports are formed in a bottom surface of the vacuum chamber 1, and the exhaust openings 61 and 62 are formed at locations corresponding to the exhaust ports in the side ring 100.

In the present specification, one of the exhaust openings 61 and 62 is referred to as a first opening 61 and the other of the exhaust openings 61 and 62 is referred to as a second opening 62. Here, the first exhaust opening 61 is formed between the separation gas nozzle 42 and the plasma generator 80 located on the downstream side of the separation gas nozzle 42 in the rotational direction of the turntable 2. Furthermore, the second exhaust opening 62 is formed between the third process gas nozzle 33 and the separation area D on the downstream side of the third process gas nozzle 33 in the rotational direction of the turntable 2.

The first exhaust opening 61 is provided to evacuate the first process gas and the separation gas, and the second exhaust opening 62 is provided to evacuate the plasma processing gas, the separation gas and the chlorine-containing gas. Each of the first exhaust opening 61 and the second exhaust opening 62 is, as illustrated in FIG. 1, connected to an evacuation mechanism such as a vacuum pump 64 through an evacuation pipe 63 including a pressure controller 65 such as a butterfly valve.

As described above, because the housings 90 are arranged from the central area C side to the outer peripheral side, a gas flowing from the upstream side in the rotational direction of the turntable 2 to the second and third process areas P2 and P3 may be blocked from going to the evacuation opening 62 by the housings 90. In response to this, a groove-like gas flow passage 101 (see FIGS. 1 and 2) is formed in the upper surface of the side ring 100 on the outer edge side of the housing 90 to allow the gas to flow therethrough.

As shown in FIG. 1, in the center portion on the lower surface of the ceiling plate 11, a protrusion portion 5 is provided that is formed into an approximately ring-like shape along the circumferential direction continuing from the central area C side of the convex portion 4 so as to have a lower surface formed as high as the lower surface of the convex portion 4 (ceiling surface 44). A labyrinth structure 110 is provided closer to the rotational center side of the turntable 2 than the protrusion portion 5 and above the core portion 21 to prevent the various gases from mixing with each other in the center area C.

As discussed above, because the housings 90 are formed at the location close to the central area C, the core portion 21 supporting the central portion of the turntable 2 is formed on the rotational center side so that a portion on the upper side of the turntable 2 is arranged apart from the housing 90. Due to this, the various gases are more likely to mix with each other at the central area C side than at the outer peripheral side. Hence, by forming the labyrinth structure 110 above the core portion 21, a flow path can be made longer to be able to prevent the gases from mixing with each other.

More specifically, the labyrinth structure 110 has a wall part vertically extending from the turntable 2 toward the ceiling plate 11 and a wall part vertically extending from the ceiling plate 11 toward the turntable 2 that are formed along the circumferential direction, respectively, and are arranged alternately in the radial direction of the turntable 2. In the labyrinth structure 110, for example, a first process gas discharged from the first process gas nozzle 31 and heading for the central area C needs to go through the labyrinth structure 110. Due to this, the first process gas decreases in speed with the decreasing the distance from the central area C and becomes unlikely to diffuse. As a result, the first process gas is pushed back by the separation gas supplied to the central area C before reaching the central area C. Moreover, other gases likely to head for the central area C are difficult to reach the central area C by the labyrinth structure 110 in a similar way. This prevents the process gases from mixing with each other in the central area C.

On the other hand, the separation gas supplied from the separation gas supply pipe 51 is likely to diffuse swiftly in the circumferential direction at first, but decreases in speed as going through the labyrinth structure 110. In this case, nitrogen gas is likely to intrude into a very narrow area such as a gap between the turntable 2 and the projection portion 92, but flows to a relatively large area such as an area where the transfer arm 10 moves in and out of the vacuum chamber 1 because the labyrinth structure 110 decreases the flowing speed thereof. Because of this, nitrogen gas is prevented from flowing into a space under the housings 90 and 190.

As illustrated in FIG. 1, a heater unit 7 that is a heating mechanism is provided in a space between the turntable 2 and the bottom part 14 of the vacuum chamber 1. The heater unit 7 is configured to be able to heat the wafer W on the turntable 2 through the turntable 2 up to, for example, a range from room temperature to about 760 degrees C. Furthermore, as illustrated in FIG. 1, a side cover member 71a is provided on a lateral side of the heater unit 7, and an upper covering member 7a is provided so as to cover the heater unit 7 from above. In addition, purge gas supply pipes 73 for purging a space in which the heater unit 7 is provided are provided in the bottom part 14 of the vacuum chamber 1 under the heater unit 7 at multiple locations along the circumferential direction.

As illustrated in FIG. 2, a transfer opening 15 is provided in the side wall of the vacuum chamber 1 to transfer the wafer W between a transfer arm 10 and the turntable 2. The transfer opening 15 is configured to be hermetically openable and closable by a gate valve G.

The wafer W is transferred between the concave portion 24 of the turntable 2 and the transfer arm 10 at a position where the concave portion 24 of the turntable 2 faces the transfer opening 15. Accordingly, lift pins and an elevating mechanism that are not illustrated in the drawings are provided at a position under the turntable 2 corresponding to the transferring position to lift the wafer W from the back surface by penetrating through the concave portion 24.

Moreover, as illustrated in FIG. 1, a control unit 120 constituted of a computer to control operation of the whole apparatus is provided in the plasma processing apparatus of the present embodiment. A program to implement the substrate process described later is stored in a memory of the control unit 120. This memory stores the program to perform the substrate process described later. This program is constituted of instructions of step groups to cause the apparatus to implement operations described later, and is installed into the control unit 120 from a memory unit 121 that is a storage medium such as a hard disk, a compact disc, a magnetic optical disk, a memory card and a flexible disk.

<Method for Depositing a Silicon Nitride Film>

Next, a method for depositing a silicon nitride film according to an embodiment of the present disclosure is described below. To begin with, a principle of the method for depositing the silicon nitride film according to the embodiment is described below. The principle is applicable to a process that does not use the above-mentioned film deposition apparatus. However, for the purpose of illustration, the principle is described by stating the relationship between the method and the above-mentioned film deposition apparatus.

Figure 9:
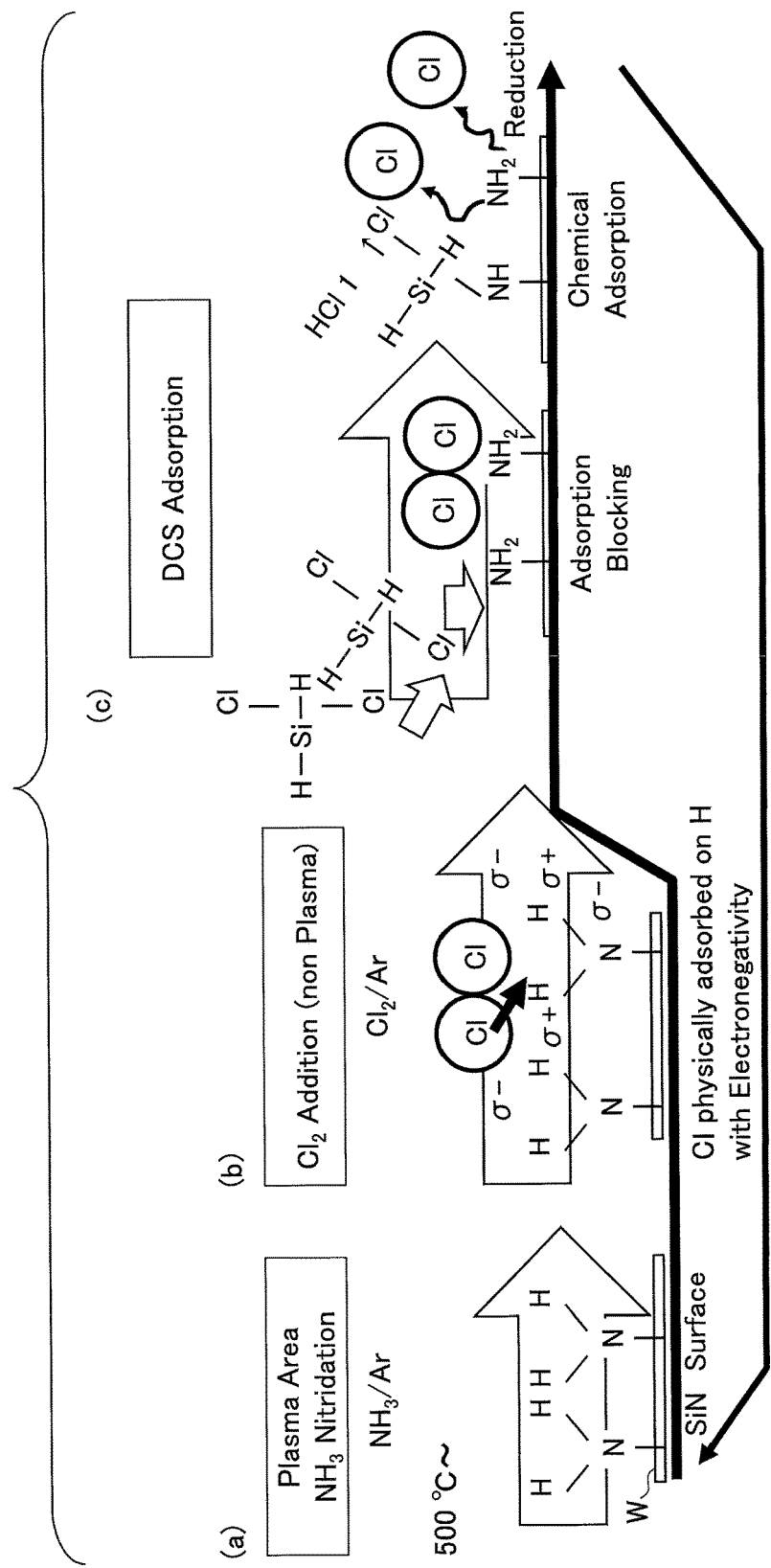
FIG. 9 is a diagram illustrating an example of a method for depositing a silicon nitride film for performing an embodiment of the present disclosure.

FIG. 9 depicts an example of the method for depositing the silicon nitride film according to the embodiment of the present disclosure. FIG. 9(*a*) depicts an example of a nitriding process. In the nitriding process, a nitriding gas is supplied to a wafer W. Thus, nitriding a surface of the wafer W, or a surface of a SiN film when the SiN film is already deposited on the surface of the wafer W, is performed. In FIG. 9(*a*), a mixed gas of $NH_3$ and Ar, which is an ammonia-containing gas, is used as the nitriding gas. In the nitriding process, the nitriding method is not limited to a specific method as long as $NH_2$ groups are formed on the surface by nitriding the film deposition object. For example, an activated nitriding gas may be supplied to the surface by using plasma. In the above-mentioned film deposition apparatus, the mixed gas of $NH_3$/Ar is supplied from the second process gas nozzle 32 in the second process area P2, and is supplied to the surface of the wafer W while being activated by the plasma generator 80. An adsorption site for a silicon-containing gas is formed on the surface of the wafer W by the nitriding process.

FIG. 9(*b*) depicts an example of a non-adsorption site forming process. In the non-adsorption site forming process, a chlorine-containing gas is supplied to the surface of the wafer W, and a non-adsorption site for the silicon-containing gas is partially formed on the surface of the wafer W by physical adsorption of chlorine gas on the $NH_2$ groups. Here, the physical adsorption of chlorine gas on the $NH_2$ groups is performed by ionic adsorption caused by a difference in electronegativity between hydrogen (H) present at the tips of $NH_2$ groups and chlorine (Cl).

Figure 10A:
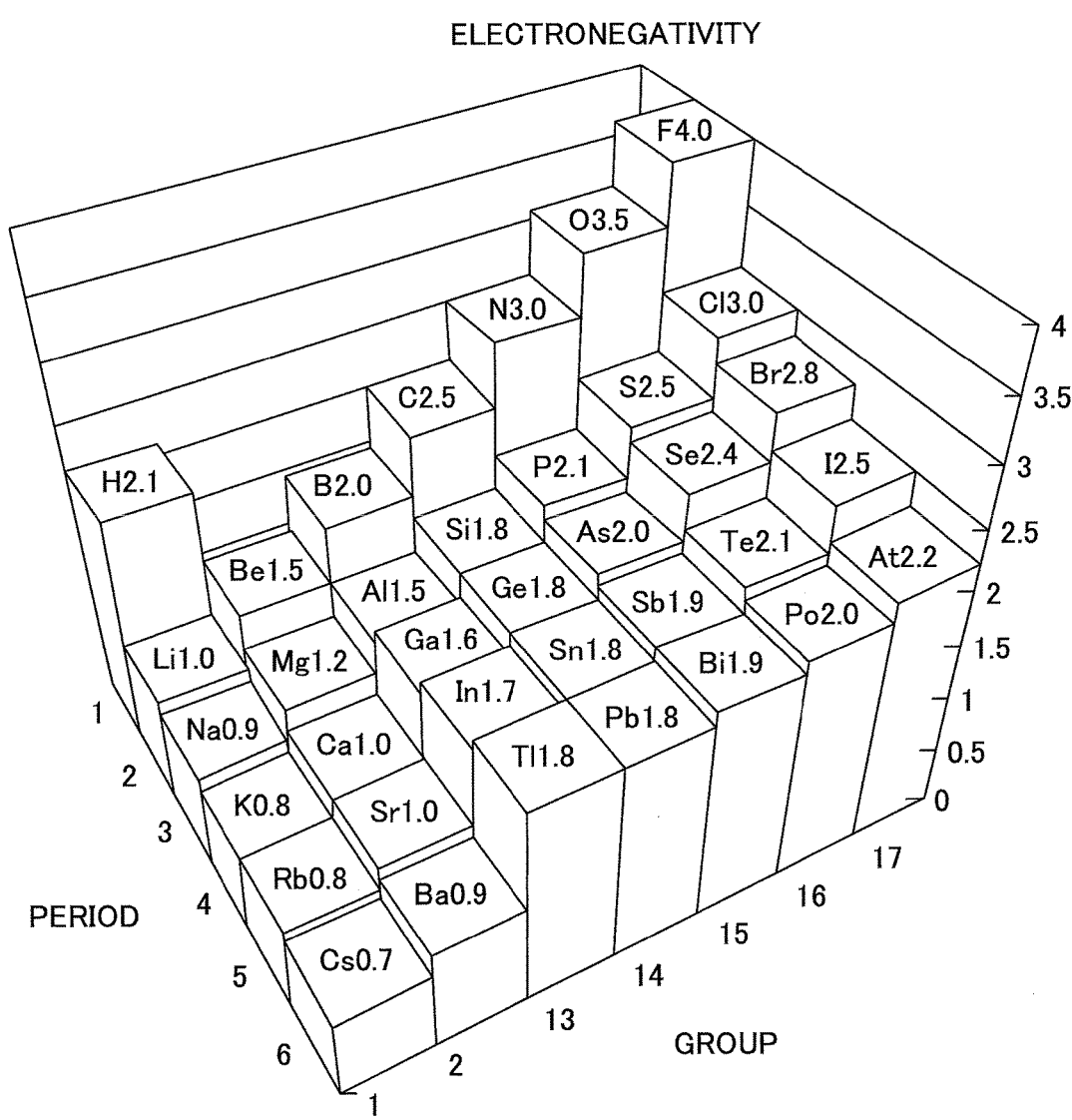

FIGS. 10A through 10O are diagrams for explaining the difference of the electronegativity between chlorine and hydrogen. FIG. 10A shows the electronegativity of major elements. In FIG. 10A, the transverse axis indicates a group, and the longitudinal axis indicates a period. The vertical axis indicates a magnitude of the electronegativity. As shown in FIG. 10A, elements have a variety of magnitudes of the electronegativity.

FIG. 10B is a table showing the electronegativity of predetermined elements containing chlorine and hydrogen. As shown by FIG. 10B, because the electronegativity of chlorine equals to 3.0 and the electronegativity of hydrogen equals to 2.1, the difference in electronegativity between chlorine and hydrogen equals to 0.9.

FIG. 10C is a table showing bond energy between predetermined atoms and the difference in electronegativity therebetween. As described in FIG. 10B, the difference in electronegativity between H—Cl is 0.9, which is smaller than 2.2 of the difference in electronegativity between Si—F and 1.7 of the difference in electronegativity between Si—O, but is greater than 0.3 of the difference in electronegativity between Si—H. Thus, the hydrogen and chlorine are considered to adsorb to each other by a certain level of attracting force that is not so strong.

FIG. 9(*b*) is described again. As illustrated in FIG. 9(*b*), chlorine adsorbs on hydrogen in the non-adsorption site forming process. Chlorine does not adsorb on all of the $NH_2$ groups, but selectively adsorbs only on a predetermined area. When the $NH_2$ groups are formed on a flat surface, it is difficult to selectively form the non-adsorption site. However, when filling a recess such as a trench or a via hole formed in a surface of a wafer W, chlorine does not always reach a deep location of the recess, which makes it possible to form the non-adsorption site only on an upper portion of the recess. Details in this regard are described later.

When the above-mentioned film deposition apparatus is used, the non-adsorption site forming process is performed by supplying the chlorine-containing gas from the third process gas nozzle 33 in the third process area P3. FIG. 9(*b*) illustrates an example of supplying a mixed gas of $Cl_2$ and Ar ($Cl_2$/Ar). In the non-adsorption forming process, plasma is not generally utilized to adsorb chlorine gas on the $NH_2$ groups by physical adsorption. In the above-mentioned film deposition apparatus, the plasma generator 80 is not provided at the third process area P3.

FIG. 9(*c*) illustrates an example of a film deposition process. In the film deposition process, a silicon-containing gas is supplied to the wafer W. The silicon-containing gas adsorbs on the $NH_2$ groups, which forms an adsorption site, but does not adsorb on the area on which $Cl_2$ is adsorbed, which is the non-adsorption site. Thus, the silicon-containing gas selectively adsorbs on the wafer W. The adsorbed silicon-containing gas releases HCl, and is deposited on the surface of the wafer W by chemical reaction, thereby depositing a SiN film on the wafer W. FIG. 9(*c*) illustrates an example of using DCS as the silicon-containing gas.

The film deposition process is performed by supplying the silicon-containing gas from the first process gas nozzle 31 in the first process area P1 in the above-mentioned film deposition apparatus. Because chlorine is not so strongly adsorbed on the $NH_2$ groups due to the physical adsorption, chlorine gradually decreases as the adsorption weakens, and disappears in the end. For example, in the above-mentioned film deposition apparatus, chlorine is likely to disappear by being blown away when the wafer W passes through the separation area D and is purged by the supplied separation gas.

By sequentially repeating the nitriding process, the non-adsorption site forming process and the film deposition process, the SiN film is gradually deposited on the wafer W, thereby carrying out the film deposition.

If the gases can be sequentially supplied to the wafer W as described above, by supplying the gases into a process chamber while switching kinds of the gases over time, the method for depositing the silicon nitride film according to the embodiment can be implemented. Thus, the method depositing the silicon nitride film can be implemented by using a variety of film deposition apparatuses, without being limited to the above-mentioned film deposition apparatus.

FIG. 11 illustrates an example of a film deposition method for filling a recess formed in a surface of a wafer W by using the principle of the film deposition method described in FIGS. 9 and 10A-10C.

FIG. 11 illustrates an example of a recess 130 formed in a surface of a wafer W. As illustrated in FIG. 11(a), the recess 130 such as a trench or a via hole is formed in the surface of the wafer W. The recess 130 is generally configured to form some pattern. For example, OH groups are formed on the surface of the wafer W including the inside of the recess 130 of the wafer W.

FIG. 11(b) illustrates an example of a nitriding process. In the nitriding process, a nitriding gas is supplied to the surface of the wafer W, and the surface of the wafer W including the inside of the recess 130 is nitrided. By performing the nitriding process, $NH_2$ groups are formed on the entire surface of the wafer W including the inside of the recess 130.

FIG. 11(c) illustrates an example of a non-adsorption site forming process. In the non-adsorption site forming process, a chlorine-containing gas is supplied to the surface of the wafer W, and chlorine gas adsorbs on the surface from the top to a predetermined depth in an upper portion range of the recess 130. As discussed above, Cl adsorbs on H of the $NH_2$ groups, and the non-adsorption site is temporarily formed. When using the above-mentioned film deposition apparatus, the adsorption of chlorine in the depth direction can be adjusted by a rotational speed of the turntable 2, a flow rate of the chlorine-containing gas and the like. In other words, when the chlorine-containing gas is supplied for a long period of time, chlorine gas adsorbs not only on the upper portion but also on the bottom surface of the recess 130, and the non-adsorption site cannot be formed only on the upper portion of the recess 130. However, by properly shortening the period of time when the chlorine-containing gas is supplied, a state in which chlorine gas adsorbs only on the upper portion of the recess 130 by physical adsorption can be created. This can be applied to a case where the film deposition method according to the embodiment can be performed by switching the supply of gases. In this case, by adjusting the gas switching time, the state in which chlorine gas adsorbs only on the upper portion of the recess 130 by physical adsorption can be created.

By performing the non-adsorption site forming process, the non-adsorption site can be formed only on an upper end portion in a range from the top end to a predetermined depth of the recess, thereby leaving the adsorption site of $NH_2$ groups below the upper end portion.

FIG. 11(d) illustrates an example of a film deposition process. In the film deposition process, a silicon-containing gas is supplied to the surface of the wafer W, and the silicon-containing gas adsorbs on the adsorption site, thereby producing a silicon nitride film by chemical reaction and depositing the silicon nitride film on the surface of the wafer W. As discussed above, the non-adsorption site is formed in the predetermined area at the upper portion of the recess 130 while the adsorption site of $NH_2$ is formed on the other area of the recess 130. Hence, the silicon nitride film is not deposited on the upper portion in the recess 130, but is deposited only on the lower portion including the bottom surface inside the recess 130. Thus, as illustrated in the lower part of FIG. 11(d), bottom-up film deposition, in which the silicon nitride film is deposited thicker on the lower portion including the bottom portion than on the upper portion inside the recess 130, can be performed.

FIG. 11(d) illustrates an example of using DCS as the silicon-containing gas.

By repeating the nitriding process, the non-adsorption site forming process and the film deposition process illustrated in FIG. 11(b)-11(d), as illustrated in a lower part of FIG. 11(d), film deposition with preferable filling characteristics can be performed while maintaining an opening shape having a V-shaped cross section. Thus, the recess 130 can be filled with the film while inhibiting generation of a void or a seam, thereby filling the recess 130 with the film having preferable step coverage (step coating characteristics, filling characteristics).

Next, experiments and working examples performed to invent and establish the film deposition method according to the embodiments are described below.

Figure 12:
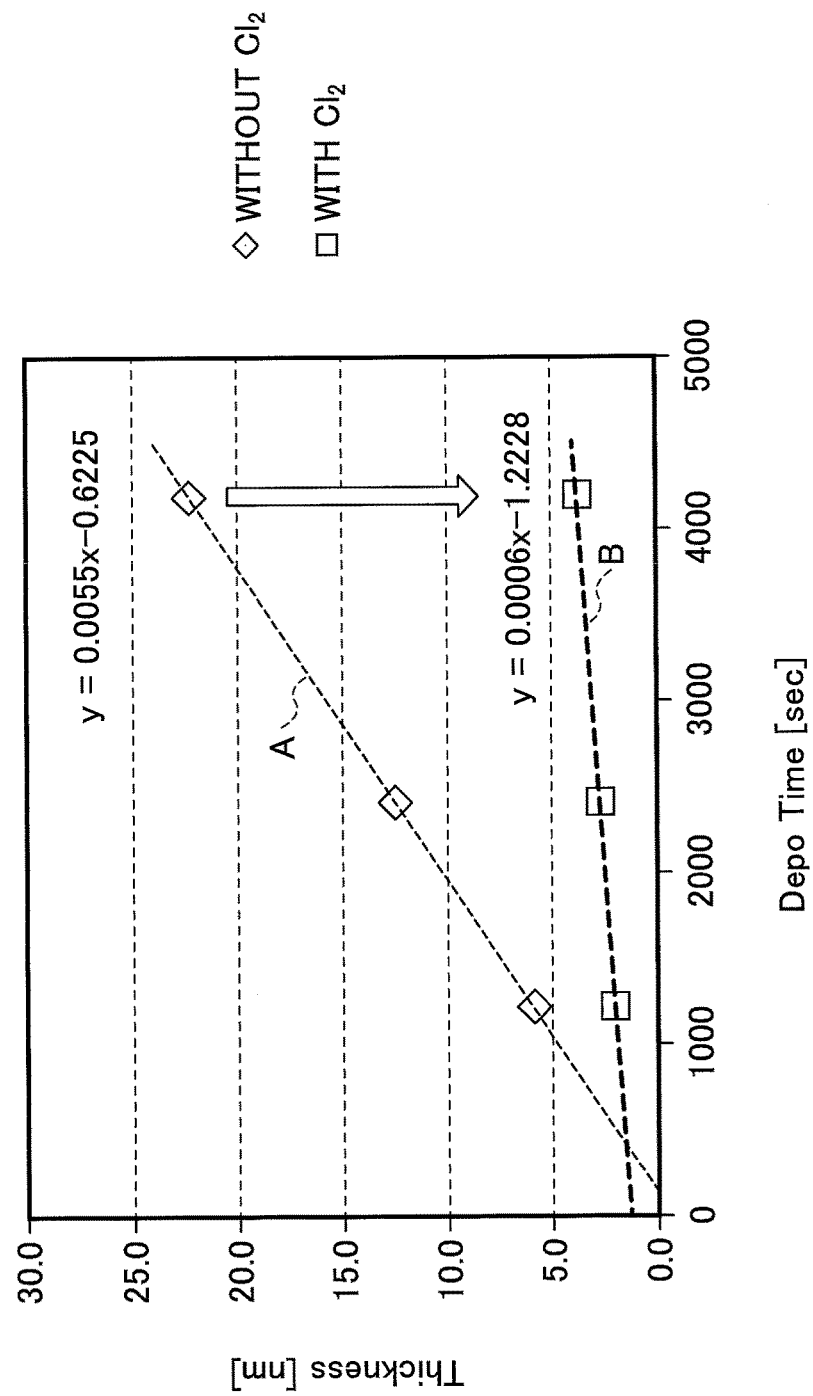
FIG. 12 is a graph showing an experimental result performed for confirming an adsorption blocking effect.

FIG. 12 shows an experimental result performed to confirm an adsorption blocking effect of chlorine. To confirm the adsorption blocking effect of chlorine, a SiN film deposition process while supplying chlorine and a SiN film deposition process without supplying chlorine were both performed, and were compared to each other. The SiN film deposition process without supplying chlorine means a film deposition process without including the non-adsorption forming process, and the SiN film deposition process while supplying chlorine means the SiN film deposition process according to the embodiment described in FIGS. 9 through 11.

The experiment was performed by using the above-mentioned turntable type ALD film deposition apparatus under conditions of wafer temperature of 500 degrees C., a pressure of 0.75 Torr, and a rotational speed of the turntable 2 at 5 rpm. DCS at a flow rate of 1000 sccm and $N_2$ of a carrier gas at a flow rate of 500 sccm were supplied as the silicon-containing gas. A mixed gas of $Ar/NH_3$ was supplied at flow rates of 2000/3000 sccm as the nitriding gas. The output power of the plasma generator 80 was set at 5 kW. A mixed gas of $Ar/Cl_2$ was suppled at flow rates of 2000/3000 sccm as the chlorine-containing gas. As discussed above, plasma was not used in supplying the chlorine-containing gas. A period of time for film deposition was set at 4200 seconds.

In FIG. 12, the transverse axis indicates a deposition time (seconds), and the longitudinal axis indicates a thickness (nm) of the SiN film. A line A shows a result without supplying chlorine, and a line B shows a result of supplying chlorine. A recess 130 was not formed in the surface of the wafer, and a film was deposited on a flat surface. As shown by FIG. 12, a film thickness of the line B supplying chlorine is significantly thinner than a film thickness of the line A without supplying chlorine, which indicates that chlorine has an effect of blocking the adsorption of DCS.

Figure 13A:
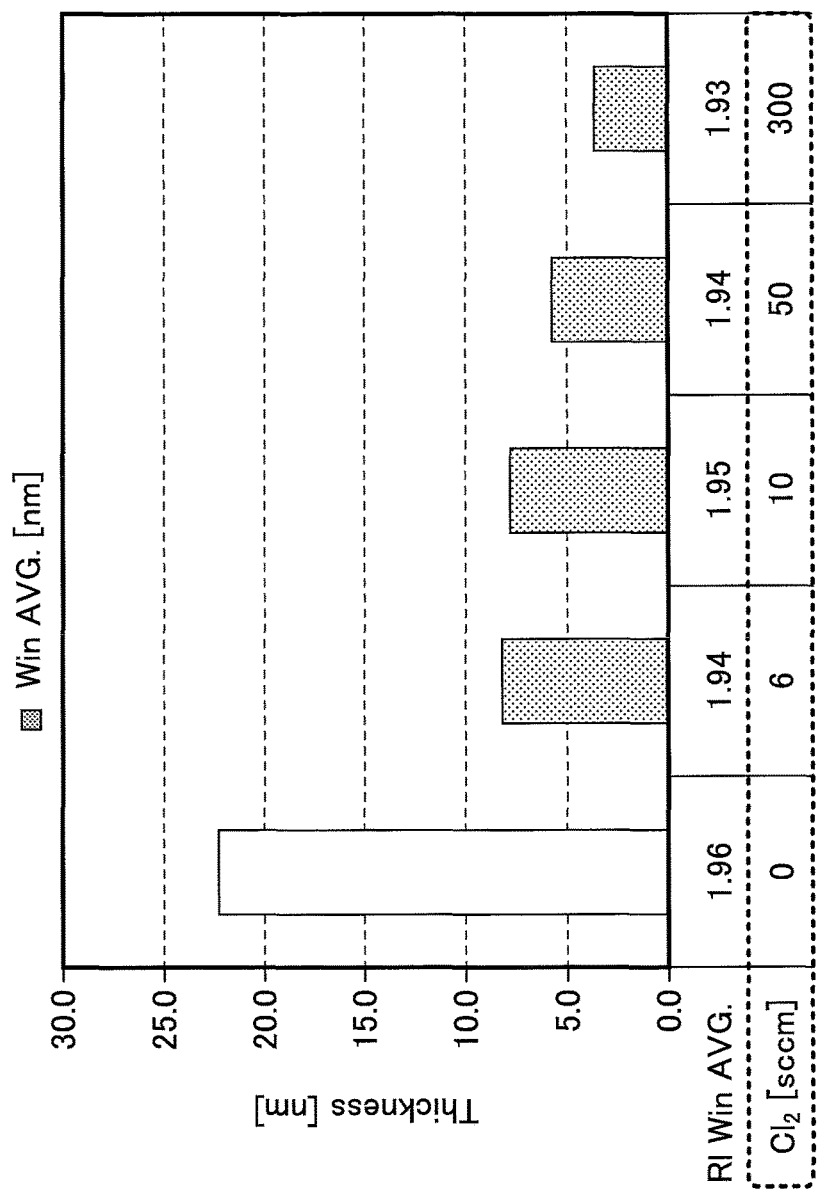
FIGS. 13A and 13B are graphs for explaining a flow rate of chlorine and adsorption blocking effect of a silicon-containing gas.
Figure 13B:
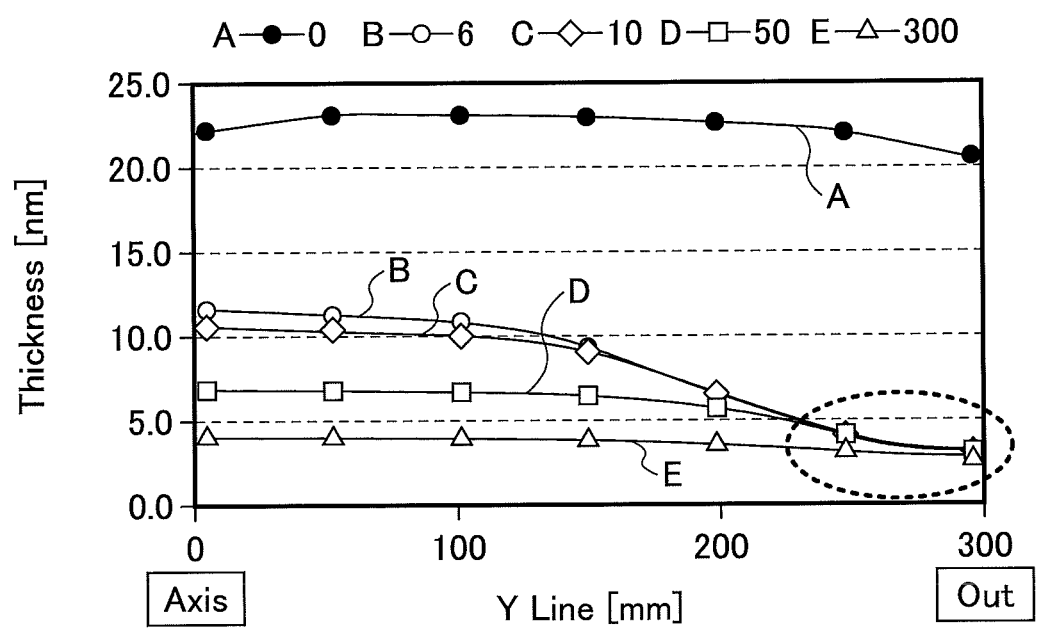

FIGS. 13A and 13B are diagrams for explaining a relationship between a flow rate of chlorine and an adsorption blocking effect of a silicon-containing gas. Effects of changing a flow rate of supplied chlorine on a film thickness and uniformity across a surface of a deposited SiN film were experimented. The experimental conditions were the same as the conditions described in FIG. 12 except for chlorine gas. The flow rate of chlorine gas was changed from 0 to 6, 10, 50 and 300 sccm while a flow rate of Ar supplied together with chlorine gas was made constant, which was a flow rate of 2000 sccm, in this experiment.

FIG. 13A shows the relationship between the flow rate of chlorine and the film thickness of SiN film. As illustrated in FIG. 13A, the film thickness of SiN film decreased as the flow rate of chlorine increased. This indicated that the deposition rate decreased as the flow rate of chlorine increased.

FIG. 13B shows the flow rate of chlorine and the film thickness of SiN film on the Y axis (i.e., axis parallel with a radial direction of the turntable 2 and passing through the center of the wafer W). Characteristic lines A, B, C, D and E show the film thicknesses when the flow rates were 0, 6, 10, 50 and 300 sccm, respectively. As illustrated in FIG. 13B, the characteristic lines B through E in which chlorine was supplied indicated an effect of blocking the adsorption of DCS at the periphery, as surrounded by a broken line. However, the effect was only exerted until the film thickness of about 3 nm, and the effect was not exerted on the film thicker than 3 nm. The film thickness increased in a location close to the center of the turntable 2 as the flow rate of chlorine decreased. However, when the flow rate of chlorine was set at 300 sccm (line E), about 3 nm film thickness was kept at the entire position on the Y axis, and an sufficient adsorption blocking effect and uniformity across the Y axis were obtained.

Thus, the experimental result of FIGS. 13A and 13B indicated that the deposition rate decreased as the flow rate of supplied chlorine increased.

Figure 14A:
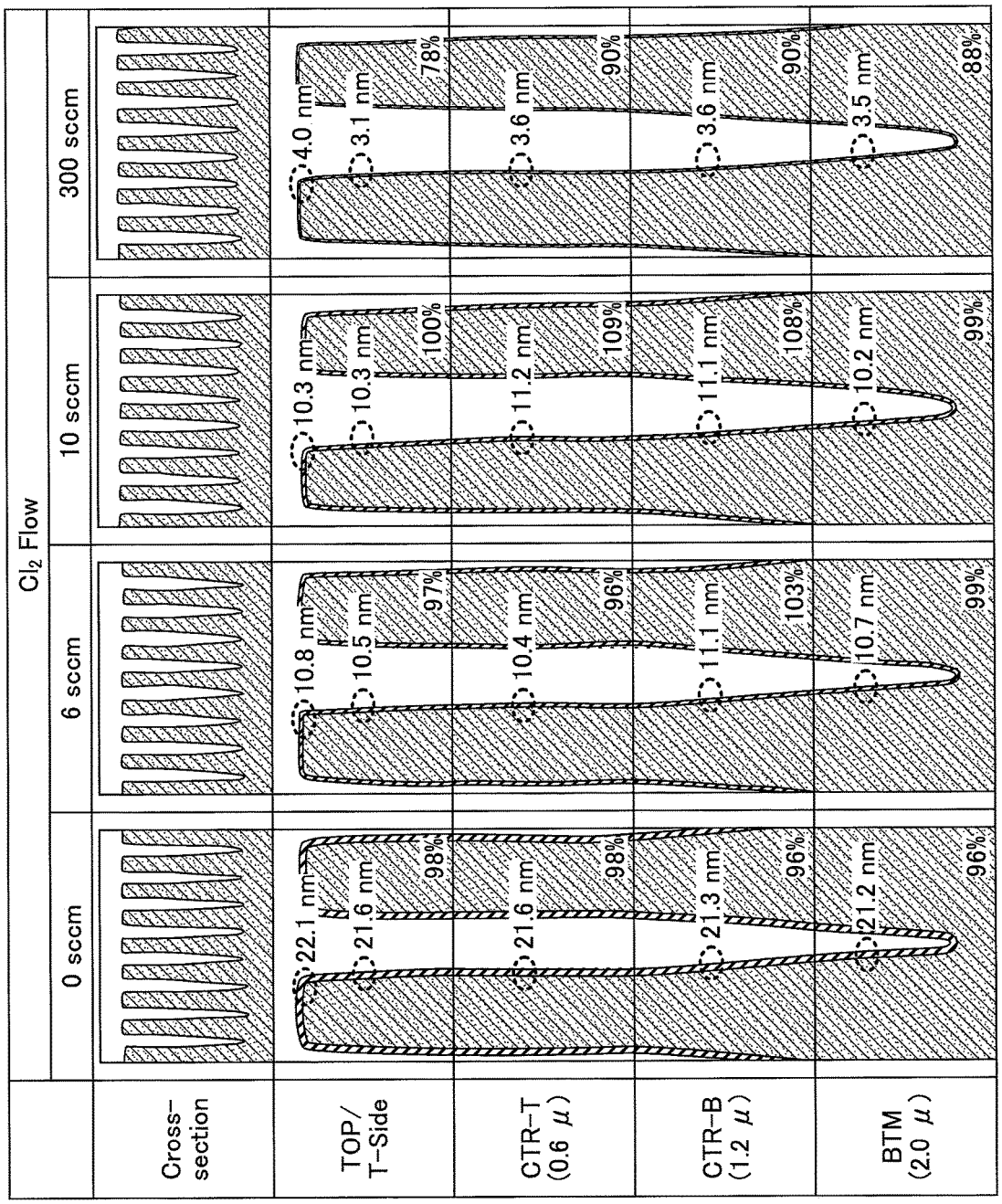
FIGS. 14A and 14B are diagrams showing a result of an experiment of changing a flow rate of chlorine supplying to a wafer with a recess formed in a surface thereof similar to FIGS. 13A and 13B.
Figure 14B:
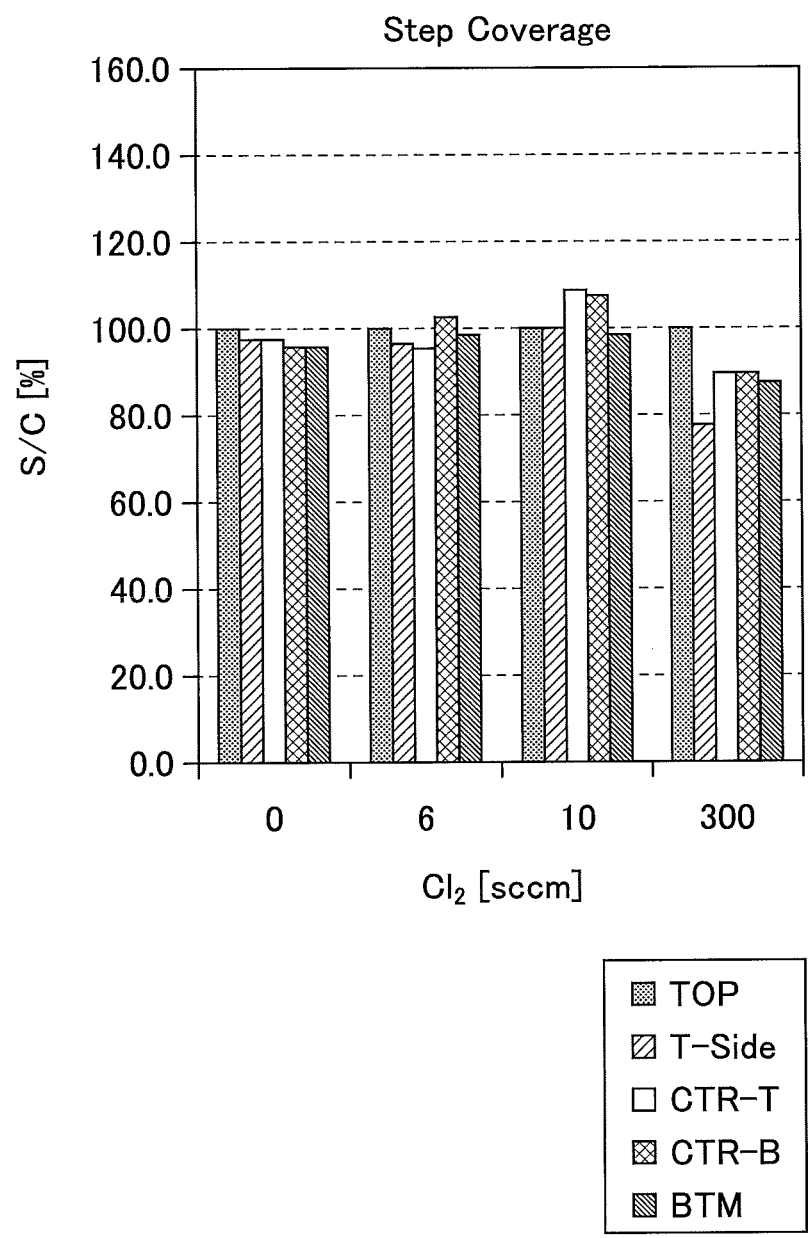

FIGS. 14A and 14B show a result of an experiment similar to FIGS. 13A and 13B of changing a flow rate of chlorine supplying to a wafer W having trench-shaped recesses 130 formed in its surface. The formed trench had an opening width of 250 nm, a depth of 2100 nm and an aspect ratio of 8.4. The experiment was performed when the flow rate of chlorine was 0, 6, 10 and 300 sccm, and was not performed with respect to the flow rate of 50 sccm, which differs from the experiment of FIGS. 13A and 13B.

FIG. 14A depicts SEM images of the experimental results. FIG. 14A shows cross sections of trenches by dividing into four areas of TOP/T-side, CTR-T, CTR-B and BTM from the top along the depth direction. Here, CTR-T indicates a location at a depth of 0.6 μm, and CTR-B indicates a location at a depth of 1.2 μm. BTM indicates a location at a depth of 2.0 μm.

In each example of the chlorine flow rates of 0, 6, 10 and 300 sccm, when the film thickness on the flat surface of the wafer W (TOP) around the top end of the recess 130 is made 100%, each percentage of the film thickness at T-Side, CTR-T, CTR-B and BTM is shown.

In FIG. 14A, when chlorine was not supplied (0 sccm), a film thickness at each pint was less than 100%, the film thickness decreased with the decreasing distance from the bottom of the trench. Thus, the deposition result is likely to block the opening of the top end.

In contrast, when chlorine was supplied at the flow rate of 6 sccm, although the film thickness at BTM was 99% and slightly thinner than 100%, the film thickness was 103% at CTR-B, which was thicker than the film thickness on the flat surface around the top end, and was 96% and 97% at CTR-T and T-Side, respectively, which were thinner than the film deposited on the top. Thus, the result indicates a preferable deposition state with preferable filling characteristics and having an opening of a V-shaped cross section.

Similarly, when chlorine was supplied at the flow rate of 10 sccm, although the film thickness at BTM was 99% and slightly thinner than 100%, the film was deposited signifi- cantly thicker at CTR-B (108%) and CTR-T (109%) than the film thickness on the flat surface around the top end, and was deposited thinner at T-Side (100%) than those at CTR-B and CTR-T. Thus, although the result is not as good as the result of the working example of the flow rate of 6 sccm, the result can be said to be in a preferable deposition state with preferable filling characteristics and having an opening of a V-shaped cross section.

When chlorine is supplied at the flow rate of 300 sccm, the film thickness was thin as a whole, as shown by 88% at BTM, 90% at CTR-B and CTR-T and 78% at T-Side. However, because the film was deposited thinner at T-Side than at BTM, CTR-B and CTR-T, the film can be said to have an approximately V-shaped cross section.

FIG. 14B shows the result of FIG. 14A by a graph. As illustrated in FIG. 14B, when the flow rate of chlorine was set at 6 sccm and 10 sccm, the film thickness at CTR-B was thicker than the film thickness at TOP and T-Side, which achieved film deposition having preferable filling character- istics. In contrast, when chlorine was not supplied, the film thickness gradually increased from the bottom surface toward the top end, which did not achieve preferable filling characteristics and did not form a V-shaped cross section although the film conformed to the surface shape of the trench.

When the flow rate of chlorine was 300 sccm, the film thickness was thicker at CTR-T, CTR-B and BTM than at T-Side, and had a slightly V-shaped cross section, but the film thickness decreased on the bottom side, which did not achieve the preferable filling characteristics.

Thus, the working examples in FIGS. 14A and 14B indicates that the V-shaped cross section and the filling characteristics during the film deposition can be properly improved by supplying chlorine during the film deposition and by adjusting the flow rate of chlorine.

Figure 15:
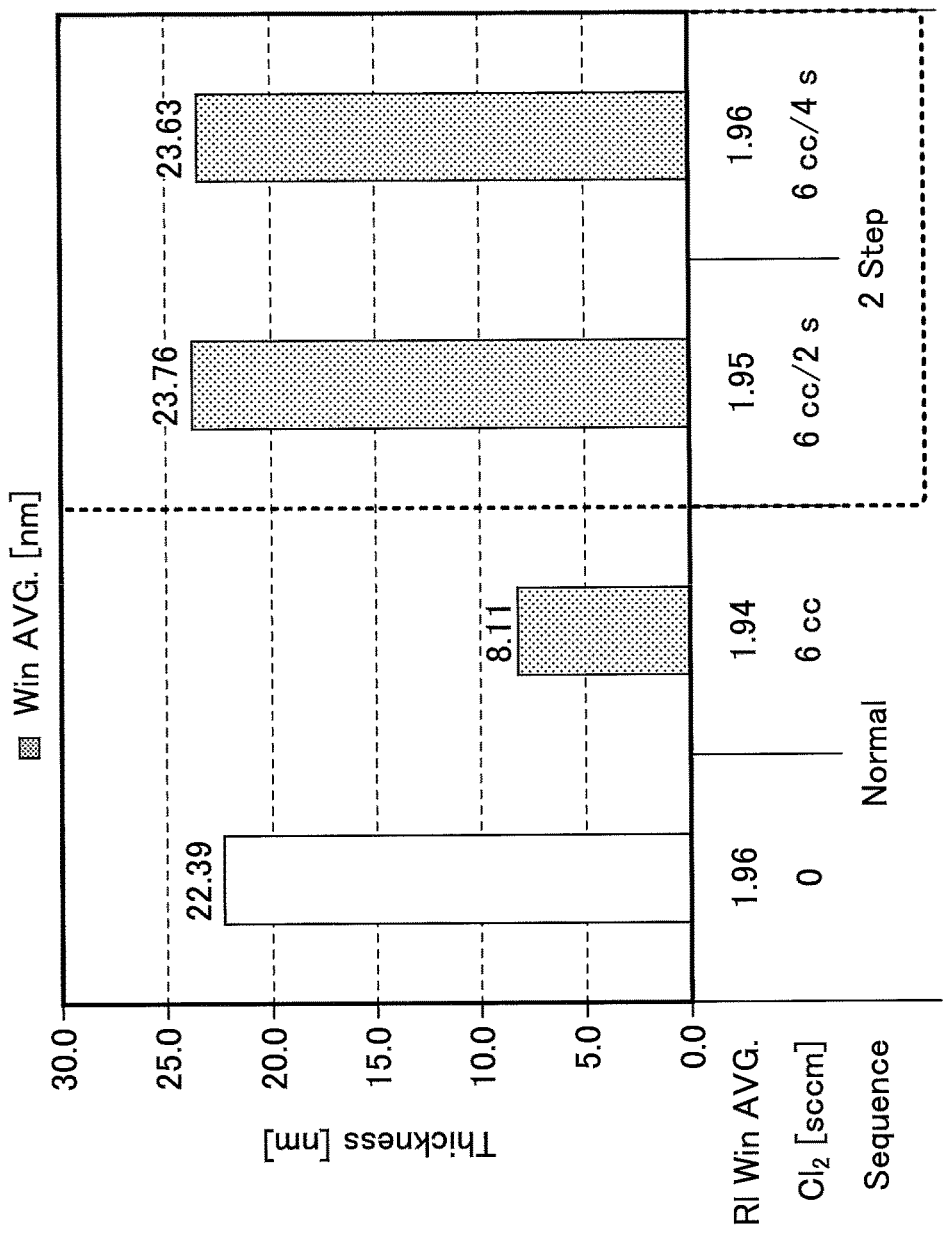
FIG. 15 is a graph showing a result of an experiment performed for confirming that adsorption of chlorine is physical adsorption.

FIG. 15 shows a result of an experiment for confirming that the adsorption of chlorine is physical adsorption. In the experiment of FIG. 15, a process of supplying chlorine during one cycle according to the embodiments, and a two-step process of performing SiN film deposition and chlorine supply separately, at two steps: depositing a SiN film without supplying chlorine, then supplying chlorine while stopping the SiN deposition, depositing a SiN film again, and then supplying chlorine again, were performed.

In FIG. 15, "Normal" on the left side shows the result of the film deposition method according to the embodiments, and "2Step" on the right side shows the result of the two-step film deposition method. The film deposition was performed under conditions of wafer temperature of 500 degrees C., a pressure of 0.75 Torr, and a rotational speed of the turntable 2 at 5 rpm. In the film deposition method according to the embodiments, the deposition conditions were the same as the conditions described above. In the two-step film depo- sition, in a deposition step, a mixed gas of DCS/$N_2$ ($N_2$: carrier gas) is supplied at flow rates of 1000/500 scorn as the silicon-containing gas, and a mixed gas of Ar/$NH_3$ was supplied at a flow rate of 2000/300 sccm. A cycle of 120 seconds was repeated 35 cycles. The output of plasma was 5 kW.

In a chlorine supplying step, a mixed gas of Ar/$Cl_2$ was supplied at a flow rate of 2000/6 sccm without generating plasma. Two cycle patterns of a 2-second cycle and a 4-second cycle were repeated 0.35 times (cycles), respec- tively. A two-step process repeating a cycle constituted of a 120-second film deposition step and a 2-second chlorine supplying step 35 cycles, and a two-step process repeating a cycle constituted of a 120-second film deposition step and a 4-second chlorine supplying step 35 times (cycles), were both performed.

As illustrated in FIG. 15, only the film deposition method of supplying chlorine at 6 sccm according to the embodiments was able to decrease the film thickness, and the process removing the chlorine supplying step (non-adsorption site forming process) from the film deposition method according to the embodiments (the leftmost column) and the two-step processes had approximately the same film thickness. This means that the two-step processes have only the same effect as the process without supplying chlorine. In other words, this means that even if chlorine is supplied by the two-step process, the effect of blocking the adsorption of the silicon-containing gas is not obtained. This means that even if chlorine is supplied, chlorine is blown away by the purge gas (separation gas) supplied between the chlorine supplying step and the film deposition step. In other words, this indicates that the adsorption of chlorine is not caused by chemical reaction, but is caused by physical adsorption in which a substance just temporarily adsorbs on a surface. Thus, the film deposition is temporarily blocked by supplying chlorine, but the block is only temporary, and serves to block the adsorption of the silicon-containing gas only the next time when the silicon-containing is supplied to the wafer W. Hence, by controlling a formation area of the non-adsorption site (i.e., depth in the recess 130), the film deposition for filling the recess 130 can be performed while forming a V-shaped cross section by the temporary block without completely blocking the overall film deposition.

The film deposition method according to the embodiments can be said to implement film deposition with preferable filling characteristics without closing the opening of the recess by utilizing the physical adsorption of chlorine.

Figure 16:
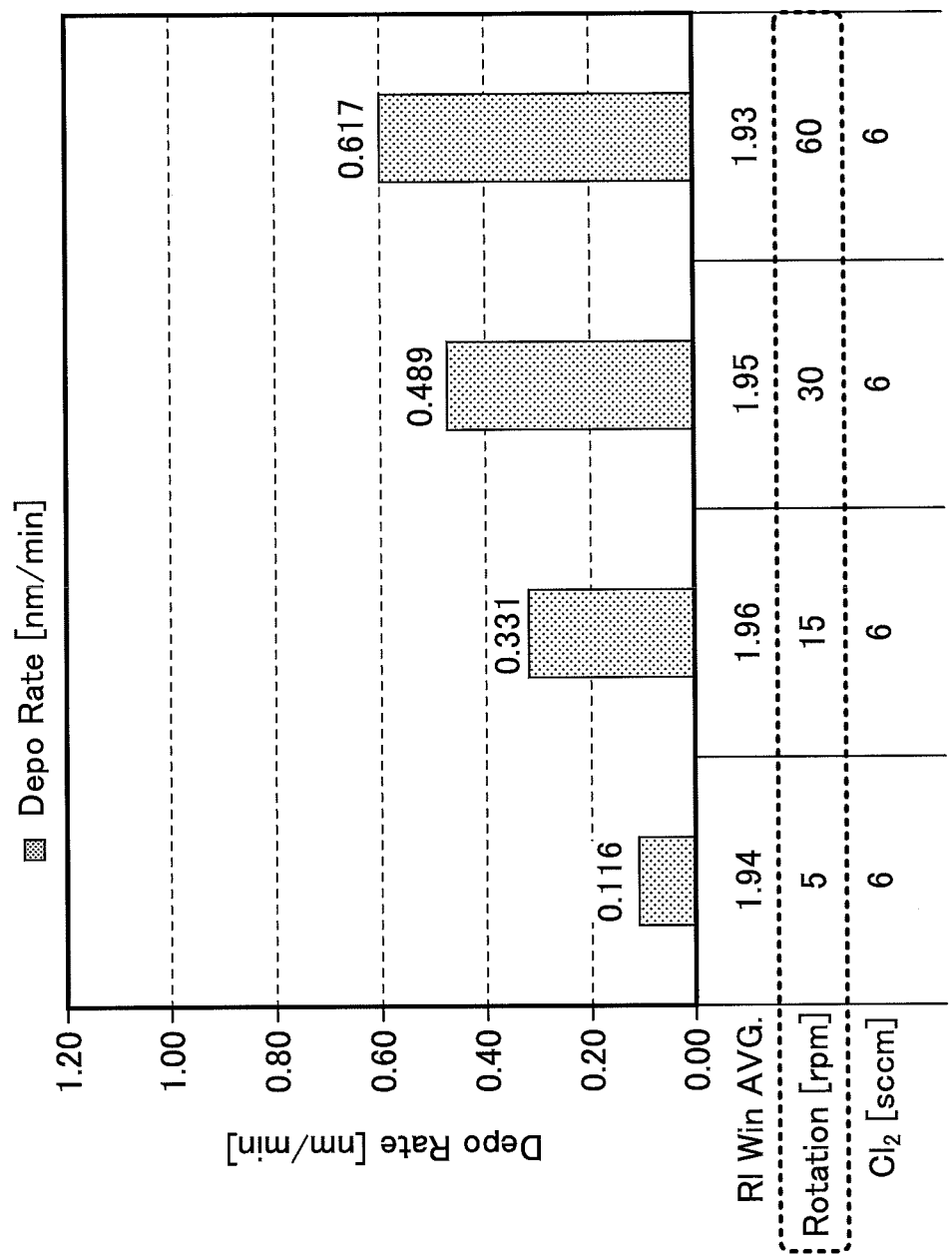
FIG. 16 is a graph showing a result of performing a method for depositing a silicon nitride film according to an embodiment of the present disclosure by changing a rotational speed of a turntable.

FIG. 16 shows a result of performing the method for depositing the SiN film according to the embodiments while changing the rotational speed of the turntable 2. The film deposition conditions were the same as the other working examples. The wafer temperature was set at 500 degrees C., and the pressure in the vacuum chamber 1 was set at 0.75 Torr. A mixed gas of $DCS/N_2$ ($N_2$: carrier gas) was supplied at 1000/500 sccm as the silicon-containing gas, and a mixed gas of $Ar/NH_3$ was supplied at 2000/6 sccm as the nitriding gas. The output power of the plasma generator 80 was set at 5 kW. A mixed gas of $Ar/Cl_2$ was supplied at a flow rate of 2000/6 sccm as the chlorine-containing gas. The rotational speed of the turntable 2 was varied from 5 rpm to 15, 30 and 60 rpm, and the film deposition was performed for 4200 seconds.

FIG. 16 indicates that the deposition rate increases as the rotational speed of the turntable 2 increases.

Figure 17A:
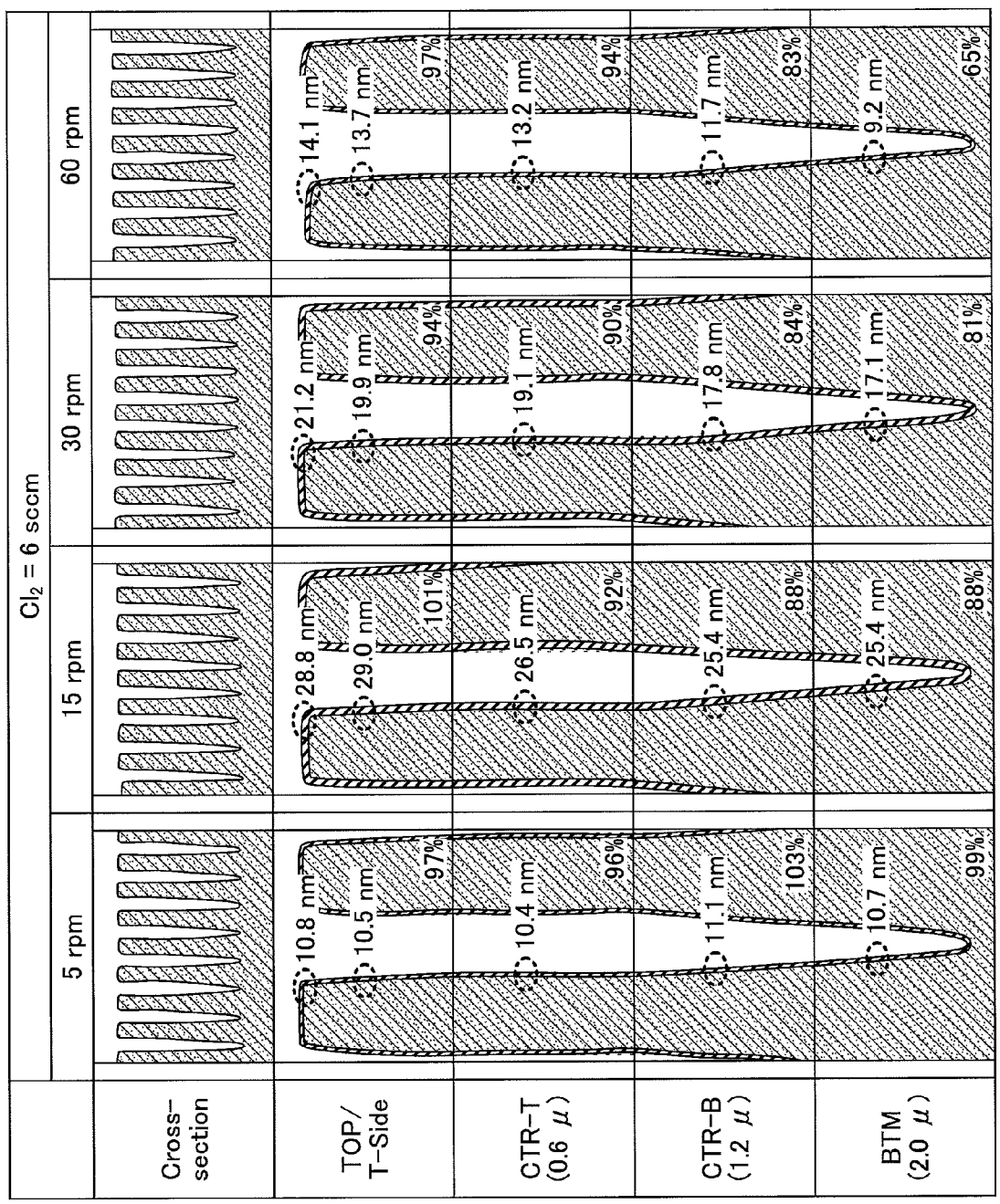
FIGS. 17A and 17B are diagrams showing recess filling characteristics of the experimental result of FIG. 16.
Figure 17B:
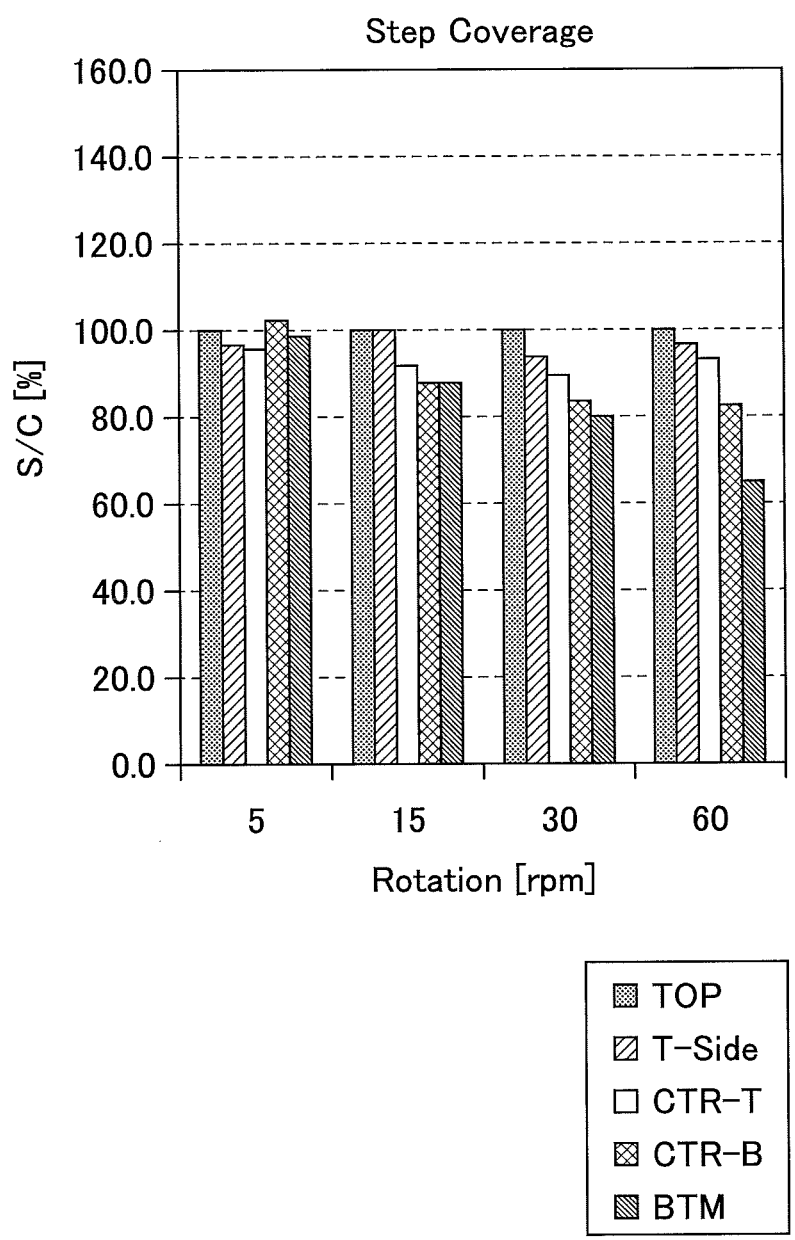

FIGS. 17A and 17B are diagrams showing filling characteristics of the experimental result described in FIG. 16. FIG. 17A depicts SEM images of the results of performing the film deposition for filling trenches formed in a surface of a wafer W while changing the rotational speed of the turntable 2 under the conditions described in FIG. 16. In each working example, the film thickness at TOP was made 100%, and the film thicknesses at T-Side, CRT-T, CRT-B and BTM were shown with reference to the film thickness at TOP similarly to the description of FIG. 14A.

In FIG. 17A, when the rotational speed was set at 5 rpm, the film thickness at BTM was 99%, which was approximately the same as TOP, and the film thickness at CTR-B was 103%, which was thicker than TOP. Moreover, the film thicknesses at CTR-T and T-Side were 96% and 97%, respectively, which were thinner than the film thickness at the lower portion. Thus, in the working example of the rotational speed at 5 rpm, the film deposition with preferable filing characteristics and having a V-shaped cross section was able to be achieved.

In contrast, in the working examples setting the rotational speed of the turntable 2 at 15, 30 and 60 rpm, any of the film thicknesses at BTM, CTR-B and CTR-T were thinner than the film thickness at T-Side, and the film deposition for filling the recess while forming the V-shaped cross section could not be achieved.

FIG. 17B shows the results of FIG. 17A by a graph. As shown in FIG. 17B, in the working example of having the rotational speed of 5 rpm of the turntable 2, the film thickness was sufficient, and the film thickness was thicker on the bottom side than on the upper side, which showed preferable filling characteristics. On the other hand, when the rotational speed of the turntable 2 was set at 15, 30 and 60 rpm, the filing characteristics on the bottom side were not preferable, and preferable filling characteristics could not be obtained compared to the result of the rotational speed at 5 rpm.

Thus, the result indicates that the rotational speed of the turntable 2 is preferred to be adjusted properly to achieve preferable filling characteristics, that the rotational speed is preferably set at a value lower than 15 rpm, and for example, that a rotational speed such as 5 rpm and 6 rpm is appropriate.

Next, with reference to FIGS. 9 and 10A-10C, the method for depositing the SiN film according to the embodiments using the above-mentioned turntable type film deposition apparatus is described below, including operation of a transfer of a wafer W.

To begin with, in carrying wafers W into the vacuum chamber 1, a gate valve G (not illustrated in the drawings) is opened. Then, the wafers W are placed on the turntable 2 by the transfer arm 10 through the transfer opening 15 while rotating the turntable 2 intermittently (see FIG. 2). A recess 130 such as a trench or a via hole is formed in a surface of a wafer W.

Next, the gate valve G is closed and the wafers W are heated to a predetermined temperature by the heater unit 7. Subsequently, a silicon-containing gas is discharged from the first process gas nozzle 31 at a predetermined flow rate, and a nitriding gas is discharged from the second process gas nozzle 32 at a predetermined flow rate. Also, a chlorine-containing gas is supplied from the third process gas nozzle 33 at a predetermined flow rate.

The inside of the vacuum chamber 1 is adjusted to a predetermined pressure by the pressure controller 65. In the plasma generator 80, the radio frequency power source 85 supplies radio frequency power with a predetermined output to the antenna 83.

The wafers W pass through the second process area P2 by the rotation of the turntable 2. In the second process area P2, the nitriding gas activated by the plasma generator 80 is supplied from the second process gas nozzle 32 to surfaces of the wafers W. Thus, adsorption sites of $NH_2$ groups are formed on the surfaces of the wafers W.

The wafers W subsequently pass through the third process area P3. In the third process area P3, a chlorine-containing gas is supplied from the third process gas nozzle 33 to the surfaces of the wafers W. Chlorine physically adsorbs on a predetermined area of an upper portion of the recess 130, and a non-adsorption site is formed in the predetermined area of the upper portion of the recess 130. The predetermined area of the upper portion in the recess 130 is an upper area having a predetermined depth from the flat top surface of the wafer W into the recess 130. The predetermined depth of the predetermined area of the upper portion is adjusted by a flow rate of chlorine and a rotational speed of the turntable 2. The flow rate of chlorine is, for example, preferably set in a range of more than 0 sccm and less than or equal to 10 sccm, and further preferably set in a range of more than 0 sccm and less than or equal to 6 sccm, or in a range from 5 sccm to 10 sccm. The flow rate of chlorine is more preferably set in a rage from 5 sccm to 6 sccm.

The rotational speed of the turntable 2 is preferably set in a range of more than 0 rpm and less than 15 rpm, and is further preferably set in a range of more than 0 rpm and less than or equal to 6 rpm, or in a range of more than or equal to 5 rpm and less than 15 rpm. Moreover, the rotational speed of the turntable 2 is more preferably set in a range from 5 rpm to 6 rpm.

The wafers W subsequently pass through the separation area D by the rotation of the turntable 2. In the separation area D, the surfaces of the wafers W are purged and cleaned by the separation gas supplied from the separation gas nozzle 41. The separation gas may be, for example, nitrogen gas or argon gas.

The wafers W subsequently pass through the first process area P1 by the rotation of the turntable 2. In the first process area P1, the silicon-containing gas is supplied from the first process gas nozzle 31 to the surfaces of the wafers W. The silicon-containing gas adsorbs on the adsorption site ($NH_2$ groups) including the bottom surface and its neighborhood in the recess 130, and a molecular layer of SiN that is a reaction product by chemical reaction is deposited on the lower portion of the recess 130.

Next, the wafers W pass through the separation area D by the rotation of the turntable 2. In the separation area D, the separation gas is supplied to the surfaces of the wafers W, and the surfaces of the wafers W are cleaned.

By continuing to rotate the turntable 2, the formation of the adsorption site by nitriding the wafer surface of the wafer W (nitriding process), the formation of the non-adsorption site in the predetermined area of the upper portion in the recess 130 (non-adsorption site forming process), the purge of the surface of the wafer W (purging process), the adsorption of the silicon-containing gas on the adsorption site and the production of the reaction product (film deposition process), and the purge of the surface of the wafer W (purging process), are periodically performed multiple times. Thus, the film deposition for filling the recess 130 is performed while forming the V-shaped cross section in the recess 130, thereby gradually filling the recess 130 with the SiN film. Because the film deposition is performed while maintaining the V-shaped cross section without closing the opening of the top end of the recess 130, the recess 130 can be filled with the SiN film while inhibiting generation of a void or a seam in the SiN film.

Thus, the method for depositing the SiN film according to the embodiment of the present disclosure can perform film deposition for filling a recess while achieving preferable filling characteristics, thereby performing high-quality film deposition.

As discussed above, a silicon nitride film can be deposited in a recess to fill the recess with preferable filling characteristics while inhibiting generation of a void.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for depositing a silicon nitride film, the method comprising steps of:
    forming a nitrided adsorption site in a recess formed in a surface of a substrate by supplying an ammonia-containing gas to the substrate for nitriding the surface of the substrate including the recess;
    forming a non-adsorption site in a predetermined upper area of the recess by adsorbing a chlorine-containing gas on the nitrided adsorption site in the predetermined upper area by physical adsorption, the predetermined upper area ranging from an upper end of the recess to a predetermined depth of the recess; and
    adsorbing a silicon-containing gas on the nitrided adsorption site other than the predetermined upper area so as to deposit a silicon nitride film by a chemical reaction between the adsorbed ammonia-containing gas and the adsorbed silicon-containing gas, the nitrided adsorption site including a bottom surface of the recess.

2. The method as claimed in claim 1, wherein the physical adsorption is caused by a difference in electronegativity between a chlorine ion and a hydrogen atom.

3. The method as claimed in claim 1, wherein the step of forming the nitrided adsorption site in the recess comprises activating the ammonia-containing gas by plasma.

4. The method as claimed in claim 1, wherein the non-adsorption site is formed without using plasma.

5. The method as claimed in claim 1, wherein the steps of forming the nitride adsorption site, forming the non-adsorption site and adsorbing the silicon-containing gas are sequentially repeated.

6. The method as claimed in claim 5, wherein the steps of forming the nitride adsorption site, forming the non-adsorption site and adsorbing the silicon-containing gas are sequentially repeated until filling up the recess with the silicon nitride film.

7. The method as claimed in claim 5, further comprising steps of:
    supplying a purge gas to the substrate between the steps of forming the non-adsorption site and adsorbing the silicon-containing gas, and between the steps of adsorbing the silicon-containing gas and forming the nitrided adsorption site.

8. The method as claimed in claim 7,
    wherein the substrate is placed on a turntable along a circumferential direction of the turntable, and the turntable is provided in a process chamber,
    wherein a nitriding area that can perform the step of forming the nitrided adsorption site, a non-adsorption site forming area that can perform the step of forming the non-adsorption site and a silicon-containing gas adsorption area that can perform the step of adsorbing the silicon-containing gas are arranged above the turntable and along a rotational direction of the turntable, and
    wherein the steps of forming the nitrided adsorption site, forming the non-adsorption site and adsorbing the silicon-containing gas are performed by rotating the turntable so that the substrate sequentially passes through the nitriding area, the non-adsorption site forming area, and the silicon-containing gas adsorption area.

9. The method as claimed in claim 8,
wherein first and second purge areas are provided between the non-adsorption site forming area and the silicon-containing gas adsorption area, and between the silicon-containing gas adsorption area and the nitriding area, and
wherein the steps of forming the nitrided adsorption site, forming the non-adsorption site, supplying the purge gas, adsorbing the silicon-containing gas and supplying the purge gas are performed by rotating the turntable so that the substrate sequentially passes through the nitriding area, the non-adsorption site forming area, the first purge area, the silicon-containing gas adsorption area and the second purge area.

10. The method as claimed in claim 8,
wherein the step of forming the non-adsorption site comprises supplying the chlorine-containing gas to the substrate at a predetermined flow rate, and
the predetermined depth of the predetermined upper area is determined by adjusting the predetermined flow rate of the chlorine-containing gas and a rotational speed of the turntable.

* * * * *